(12) United States Patent
Liaw

(10) Patent No.: US 10,312,332 B2
(45) Date of Patent: Jun. 4, 2019

(54) SEMICONDUCTOR DEVICE AND METHOD OF FORMING THE SAME

(71) Applicant: TAIWAN SEMICONDUCTOR MANUFACTURING CO., LTD., Hsinchu (TW)

(72) Inventor: Jhon-Jhy Liaw, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/489,841

(22) Filed: Apr. 18, 2017

(65) Prior Publication Data

US 2018/0301559 A1    Oct. 18, 2018

(51) Int. Cl.
| | |
|---|---|
| H01L 29/40 | (2006.01) |
| H01L 27/088 | (2006.01) |
| H01L 29/66 | (2006.01) |
| H01L 23/485 | (2006.01) |
| H01L 21/8238 | (2006.01) |
| H01L 21/84 | (2006.01) |
| H01L 29/417 | (2006.01) |
| H01L 29/78 | (2006.01) |
| H01L 27/092 | (2006.01) |
| H01L 27/12 | (2006.01) |
| H01L 29/165 | (2006.01) |

(52) U.S. Cl.
CPC .... *H01L 29/401* (2013.01); *H01L 21/823821* (2013.01); *H01L 21/845* (2013.01); *H01L 23/485* (2013.01); *H01L 27/0886* (2013.01); *H01L 27/0924* (2013.01); *H01L 27/1211* (2013.01); *H01L 29/41791* (2013.01); *H01L 29/66795* (2013.01); *H01L 29/785* (2013.01); *H01L 29/7848* (2013.01); *H01L 29/165* (2013.01); *H01L 29/665* (2013.01)

(58) Field of Classification Search
CPC ......... H01L 21/76831; H01L 29/66969; H01L 29/78648; H01L 29/7869; H01L 29/78696; H01L 21/76805; H01L 21/76895; H01L 23/485; H01L 23/53238; H01L 23/53266; H01L 23/5329; H01L 23/53295; H01L 23/535
See application file for complete search history.

(56) References Cited

U.S. PATENT DOCUMENTS

| | | | |
|---|---|---|---|
| 8,772,109 | B2 | 7/2014 | Colinge |
| 8,785,285 | B2 | 7/2014 | Tsai et al. |

(Continued)

*Primary Examiner* — Meiya Li
(74) *Attorney, Agent, or Firm* — McClure, Qualey & Rodack, LLP

(57) ABSTRACT

A semiconductor device is provided, which includes a substrate, a gate and a gate contact. The substrate has a well region, which has a source, a drain and a channel region extending between the source and the drain. The gate is on the well region and extends across the channel region. The gate contact is directly on the gate and vertically overlaps with the channel region. The gate contact has a strip shape of which a ratio of a length to a width is at least 2. The gate contact includes a gate conductive plug and a gate contact dielectric. The gate conductive plug directly contacts the gate. The gate contact dielectric surrounds side surfaces of the gate conductive plug and has a frame shape. A dielectric constant of the gate contact dielectric is substantially greater than 4.9.

20 Claims, 15 Drawing Sheets

(56) References Cited

U.S. PATENT DOCUMENTS

| | | |
|---|---|---|
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,466,727 B1 * | 10/2016 | Hsu .................. H01L 29/7869 |
| 9,520,482 B1 | 12/2016 | Chang et al. |
| 9,576,814 B2 | 2/2017 | Wu et al. |
| 2003/0127752 A1 * | 7/2003 | Kim ..................... H01L 27/11 |
| | | 257/213 |

* cited by examiner

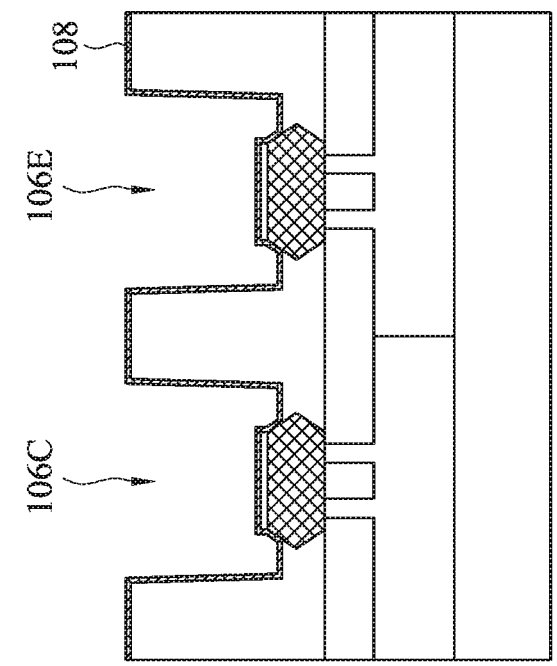
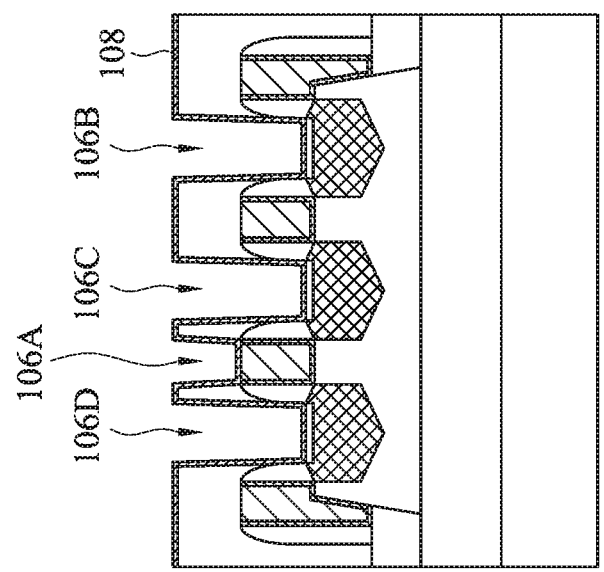
FIG. 3C (b)
FIG. 3C (a)

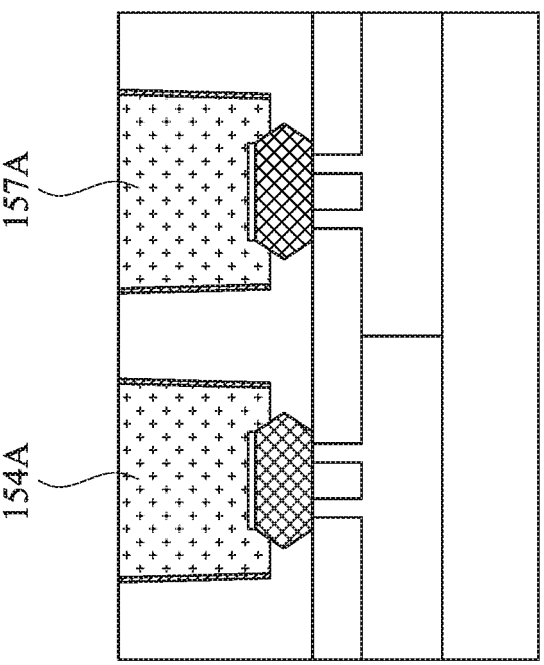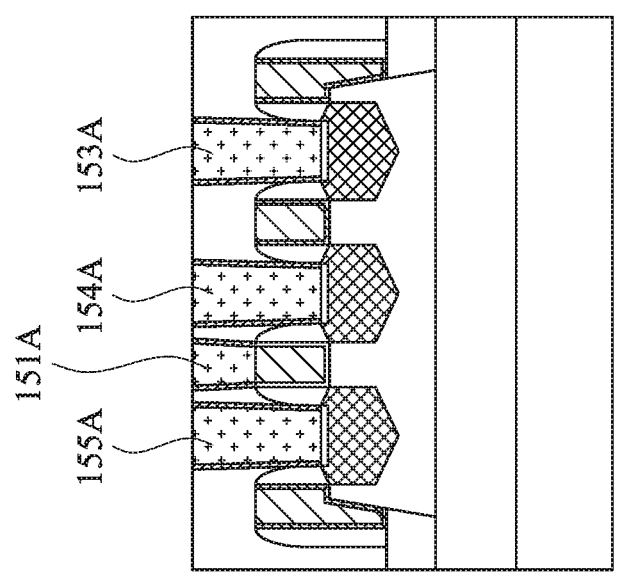
FIG. 3F (a)
FIG. 3F (b)

SEMICONDUCTOR DEVICE AND METHOD OF FORMING THE SAME

BACKGROUND

The recent trend in miniaturizing integrated circuits (ICs) has resulted in smaller devices which consume less power, yet provide more functionality at higher speeds than before. The miniaturization process has also resulted in various developments in IC designs and/or manufacturing processes to ensure production yield and intended performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
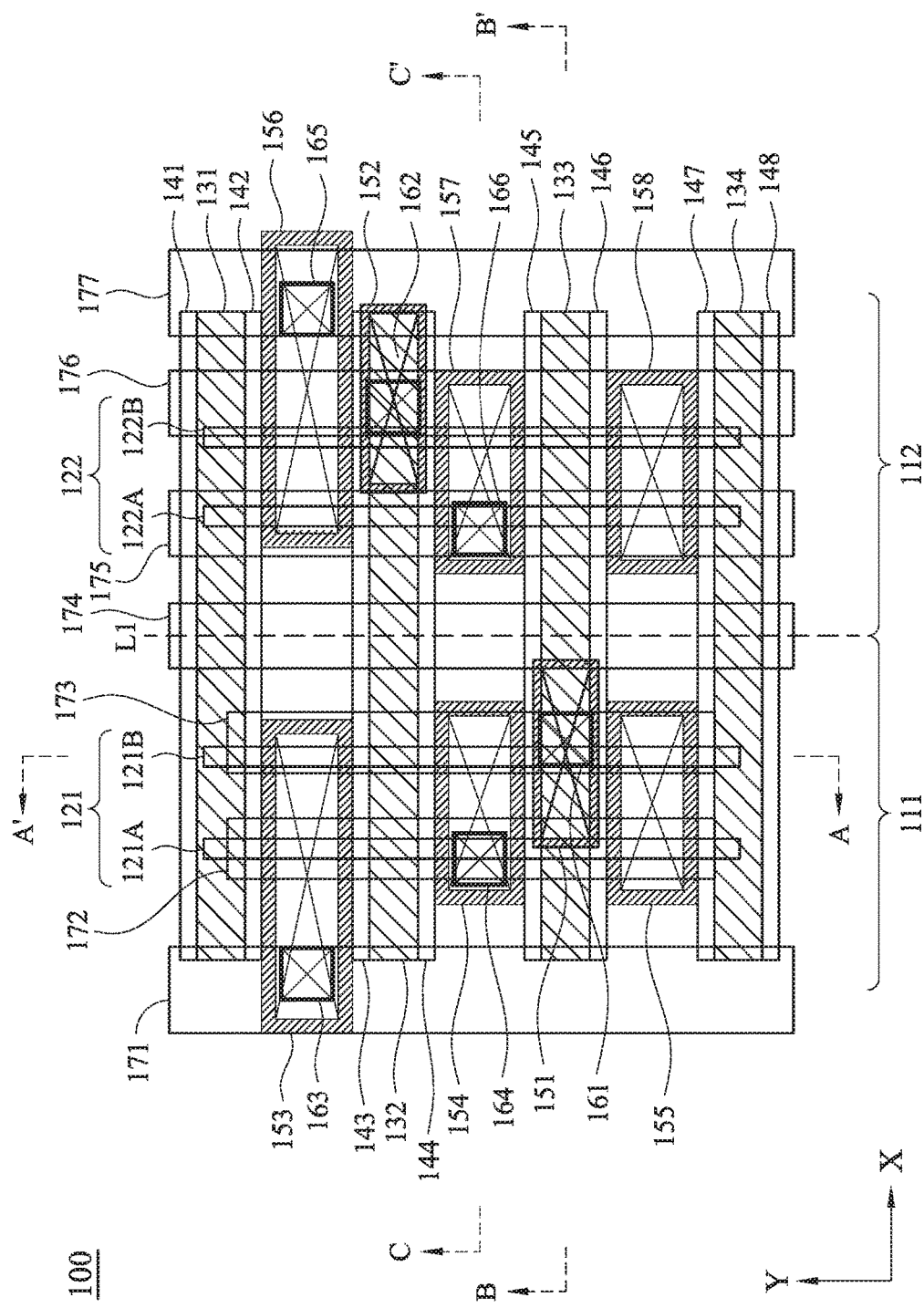
FIG. 1 is a schematic layout diagram of a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the term "one" or "the" of the single form may also represent the plural form. In addition, the present disclosure may repeat reference numerals and/or letters in the various examples. This repetition is for the purpose of simplicity and clarity and does not in itself dictate a relationship between the various embodiments and/or configurations discussed. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly.

It will be understood that, although the terms "first," "second," etc., may be used in the claims to describe various elements and/or features, these elements and/or features should not be limited by these terms, and these elements and/or features correspondingly described in the embodiments are presented by different reference numbers. These terms are used to distinguish one element and/or feature from another. For example, a first element could be termed a second element, and, similarly, a second element could be termed a first element, without departing from the scope of the embodiments. As used herein, the term "and/or" includes any and all combinations of one or more of the associated listed items.

Further, spatially relative terms, such as "upper," "lower," "on," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Embodiments of the present disclosure are directed to a semiconductor device, in which one or more gate contacts and/or one or more source/drain contacts respectively for electrically coupling gate(s) and/or source/drain(s) may be arranged overlapping with channel regions of the semiconductor device for increasing design flexibility. Each of gate contacts and/or one or more source/drain contacts includes a conductive plug and a contact dielectric surrounding side surfaces of the conductive plug, and such contact dielectric has a dielectric constant higher than that of a surrounding inter-layer dielectric (ILD) layer interposed between transistors and external devices and conductive elements, and therefore a bridge issue of a gate contact and/or an overlaying conductive device (such as a via) to a source/drain without impacting a landing margin of a source/drain contact to the source/drain. In addition, each of the gate contact(s) and/or the source/drain contact(s) has a strip shape (or called as a rectangular shape or a slot shape), so as to increase the contacting areas of the gate contact(s) with the corresponding gate(s) and/or the source/drain contact(s) with the corresponding source/drain(s).

Referring to FIG. 1, FIG. 1 exemplarily illustrates a layout diagram of a semiconductor device 100 in accordance with some embodiments. As shown in FIG. 1, the semiconductor device 100 includes a first well region 111, a second well region 112, channel regions 121 and 122, gates 131-134, spacers 141-144, gate contacts 151 and 152, source/drain contacts 153-158, vias 161-166 and metal lines 171-177, in which the channel region 121, the gate contact 151, the source/drain contacts 153-155, the vias 161-163 are within the area of the first well region 111, the channel region 122, the gate contact 152, the source/drain contacts 156-158, the vias 164-166 are within the area of the second well region 112, and the gates 131-134 and the spacers 141-144 extend from the first well region 111 to the second well region 112.

The first well region 111 and the second well region 112 may be, for example, an N-well region and a P-well region, respectively, or a P-well region and an N-well region, respectively. The first well region 111 and the second well region 112 are on opposite sides of an imaginary line L1 which separates the semiconductor device 100 into two semiconductor structures for different types of devices or transistors. Examples of the transistors the semiconductor device 100 may be, bipolar junction transistors (BJTs), high voltage transistors, high frequency transistors, field-effect transistors (FETs), fin FETs (FinFETs), planar metal oxide semiconductor (MOS) transistors with raised source/drains, MOS FETs (MOSFETs), complementary MOS (CMOS) transistors, or the like.

The channel regions 121 and 122 extend along a first horizontal direction of the semiconductor device 100, e.g., the Y direction. The channel regions 121 and 122 may include a semiconductor material such as, but not limited to, silicon, germanium and compound semiconductor, and may be doped with various types of P-type dopants and/or N-type dopants. In some embodiments, the channel region 121 is a P-type doped channel region on the first well region 111 of N-type, while the channel region 122 is an N-type doped channel region on the second well region 112 of P-type. In other embodiments, the channel region 121 is an N-type doped channel region on the first well region 111 of P-type, while the channel region 122 is a P-type doped channel region on the second well region 112 of N-type. Each of the channel regions 121 and 122 may include one or more fins as channel regions to form FinFETs, which may include 2D-FinFET structures, 3D-FinFET structures, and/or combinations thereof.

In some exemplary embodiments, as illustrated in FIG. 1, each of the channel regions 121 and 122 includes two fins. The channel region 121 includes fins 121A and 121B, and the channel region 122 includes fins 122A and 122B. The fins 121A, 121B, 122A and 122B are physically isolated. It is noted that other numbers of fins in each of the channel regions 121 and 122 are within the scope of various embodiments. For various embodiments, the channel regions 121 and 122 may include different numbers of fins. In certain embodiments, the channel regions 121 and 122 are configured for forming planar MOSFET transistors, neither of which having fins.

The gates 131-134 extend along a second horizontal direction of the semiconductor device 100, e.g., the X direction. The gates 131-134 may include, for example, polysilicon, metal, combinations thereof, and/or other suitable material. The active area regions 111 and 112 and the gate electrodes 131-134 form one or more transistors of the semiconductor device 100. In an exemplary example, the gate 133 and the channel region 121 are configured for forming a P-type MOSFET, the gate 132 and the channel region 122 are configured for forming an N-type MOSFET, and the gates 131 and 134 are configured as dummy gates. One of a source or a drain (hereinafter referred to as "source/drain") of the P-type MOSFET (including the gate 133) is defined by a portion of the channel region 121 on one side of the gate 133, and the other source/drain of the P-type MOSFET is defined by another region of the channel region 121 on the opposite side of the gate 133. Similarly, one source/drain of the N-type MOSFET (including the gate 132) is defined by a portion of the channel region 122 on one side of the gate 132, and the other source/drain of the N-type MOSFET is defined by another region of the channel region 122 on the opposite side of the gate 132. In certain embodiments, further transistors may be formed by the channel regions 121 and 122 and the gates 132 and 133. Distances of all combinations of two neighboring ones of the gates 131-134 may be substantially the same. That is, the distances between the gates 131 and 132, between the gates 132 and 133 and between the gates 133 and 134 may be substantially the same.

The spacers 141-148 are arranged at opposite sides of the corresponding gates 131-134 for electrically isolating the gates 131-134. As shown in FIG. 1, the spacers 141 and 142 are arranged at two opposite sides of the gate 131, the spacers 143 and 144 are arranged at two opposite sides of the gate 132, the spacers 145 and 146 are arranged at two opposite sides of the gate 133, and the spacers 147 and 148 are arranged at two opposite sides of the gate 134. In particular, each of the spacers 141-148 may include one or more dielectric materials for electrically isolating the corresponding gates 131-134 from unintended electrical contacts.

The gate contacts 151 and 152 respectively vertically overlap with the corresponding channel regions 121, 122 and the corresponding gates 133 and 132. In particular, as shown in FIG. 1, the gate contact 151 vertically overlaps with the fin 121B of channel region 121 and the gate 133, and the gate contact 152 vertically overlaps with the fin 122B of channel region 122 and the gate 132. Each of the gate contacts 151 and 152 may have a ratio of a length (e.g. along the X direction) to a width (e.g. along the Y direction) may be at least 2, in order to increase the contacting areas of the gate contact 151 with the gate 133 and the gate contact 152 with the gate 132. In addition, the width of each of the gate contacts 151 and 152 may be the same as or greater than the widths of the gates 133 and 132. Other arrangements of the gate contacts 151 and 152 may be applied in various embodiments. For example, the gate contact 151 may also vertically overlap with the fin 121A of channel region 121 and the gate 133, and the gate contact 152 may also vertically overlap with the fin 122A of channel region 122 and the gate 132.

The source/drain contacts 153-158 respectively vertically overlap with the corresponding regions of the first well region 111 and the second well region 112. In particular, as shown in FIG. 1, the source/drain contact 153 vertically overlaps with a portion of the first well region 111 between the gates 131 and 132, the source/drain contact 154 vertically overlaps with a portion of the first well region 111 between the gates 132 and 133, the source/drain contact 155 vertically overlaps with a portion of the first well region 111 between the gates 133 and 134, the source/drain contact 156 vertically overlaps with a portion of the second well region 112 between the gates 131 and 132, the source/drain contact 157 vertically overlaps with a portion of the second well region 112 between the gates 132 and 133, and the source/drain contact 158 vertically overlaps with a portion of the second well region 112 between the gates 133 and 134.

The gate contacts 151 and 152 and the source/drain contacts 153-158 are spaced from each other. In some embodiments, one or all of the gate contacts 151 and 152 and the source/drain contacts 153-158 are spaced from the spacers 141-148.

Each of the portions of the first well region 111 and the second well region 112 respectively vertically overlapped with the source/drain contacts 153-158 may include a source/drain of a corresponding transistor in the first well region 111 or the second well region 112. In some embodiments, in the area of the first well region 111, the source/drain contact 154 vertically overlaps with one source/drain of the P-type MOSFET (including the gate 133), and the source/drain contact 155 vertically overlaps with the other source/drain of the P-type MOSFET. Similarly, in some embodiments, in the area of the second well region 112, the source/drain contact 156 vertically overlaps with one source/drain of the N-type MOSFET (including the gate 132), and the source/drain contact 157 vertically overlaps with the other source/drain of the N-type MOSFET. Each of the source/drain contacts 153-158 may have a ratio of a length (e.g. along the X direction) to a width (e.g. along the Y direction) may be at least 2, in order to increase the contacting areas of the source/drain contacts 153-158 with the corresponding areas of source/drain in the first well region 111 or the second well region 112. In addition, the width of each of the source/drain contacts 153-158 may be the same as or greater than the distance between the corresponding neighboring ones of the spacers 141-148 which are located at two different gates. For illustration, the width of source/drain contact 153 may be the same as or greater than the distance between the spacers 142 and 143. In certain embodiments, one or more of the source/drain contacts 153-158 are spaced from the spacers 141-148.

In some embodiments, as shown in FIG. 1, the source/drain contacts 153-155 vertically overlap with fins 121A and 121B of the channel region 121, and the source/drain contact 156-158 vertically overlap with the channel region 122. Other arrangements may be applied in various embodiments. For example, one or more of the source/drain contacts 153-155 may vertically overlap with one of the fins 121A and 121B the channel region 121, and one or more of the source/drain contacts 156-158 may vertically overlap with one of the fins 122A and 122B the channel region 122.

The vias 161-166 are located above and contacts the corresponding gate contacts 151 and 152 and the source/drain contacts 153, 154, 156 and 157, respectively. One or more of the vias 161-166 may vertically overlap with the channel region 121 or 122. As shown in FIG. 1, the via 161 vertically overlaps with the fin 121B of the channel region 121, the via 162 vertically overlaps with the fin 122B of the channel region 122, the via 164 vertically overlaps with the fin 121A of the channel region 121, and the via 166 vertically overlaps with the fin 122A of the channel region 122, and each of the vias 163 and 166 is spaced from the channel regions 121 and 122 in the vertical direction of the semiconductor device 100 depending on various design requirements. In other embodiments, one or all of the vias 163 and 166 may overlap with the channel region 121 or 122 depending on various design requirements.

The metal lines 171-177 are arranged along the Y direction and vertically overlapping with the gates 131-134. The metal lines 171-177 may be used for electrically coupling the conductive elements of the semiconductor device 100 with external devices. As shown in FIG. 1, the metal line 171 is arranged overlapping with and electrically coupling the via 163 and the source/drain contact 153. Similarly, the metal line 177 is arranged overlapping with and electrically coupling the via 165 and the source/drain contact 156. In some embodiments where the semiconductor device 100 includes the first well region 111 of N-type, the second well region 112 of P-type, an MOSFET of P-type (including the gate 133) and an MOSFET of N-type (including the gate 132), the metal line 172 is arranged over the via 164 and electrically couples the via 164, the source/drain contact 154 and a source/drain that is below and contacts the source/drain contact 154, the metal line 173 is arranged over the via 161 and electrically couples the via 161, the gate contact 151 and the gate 133, the metal line 175 is arranged over the via 166 and electrically couples the via 166, the source/drain contact 157 and a source/drain that is below and contacts the source/drain contact 157, and the metal line 176 is arranged over the via 162 and electrically couples the via 162, the gate contact 152 and the gate 132. The arrangements of the vias 161-166 for electrically coupling the gate contacts 151 and 152, the source/drain contacts 153-158 and the metal lines 171-177 may be modified depending on various design requirements.

Figure 2A:
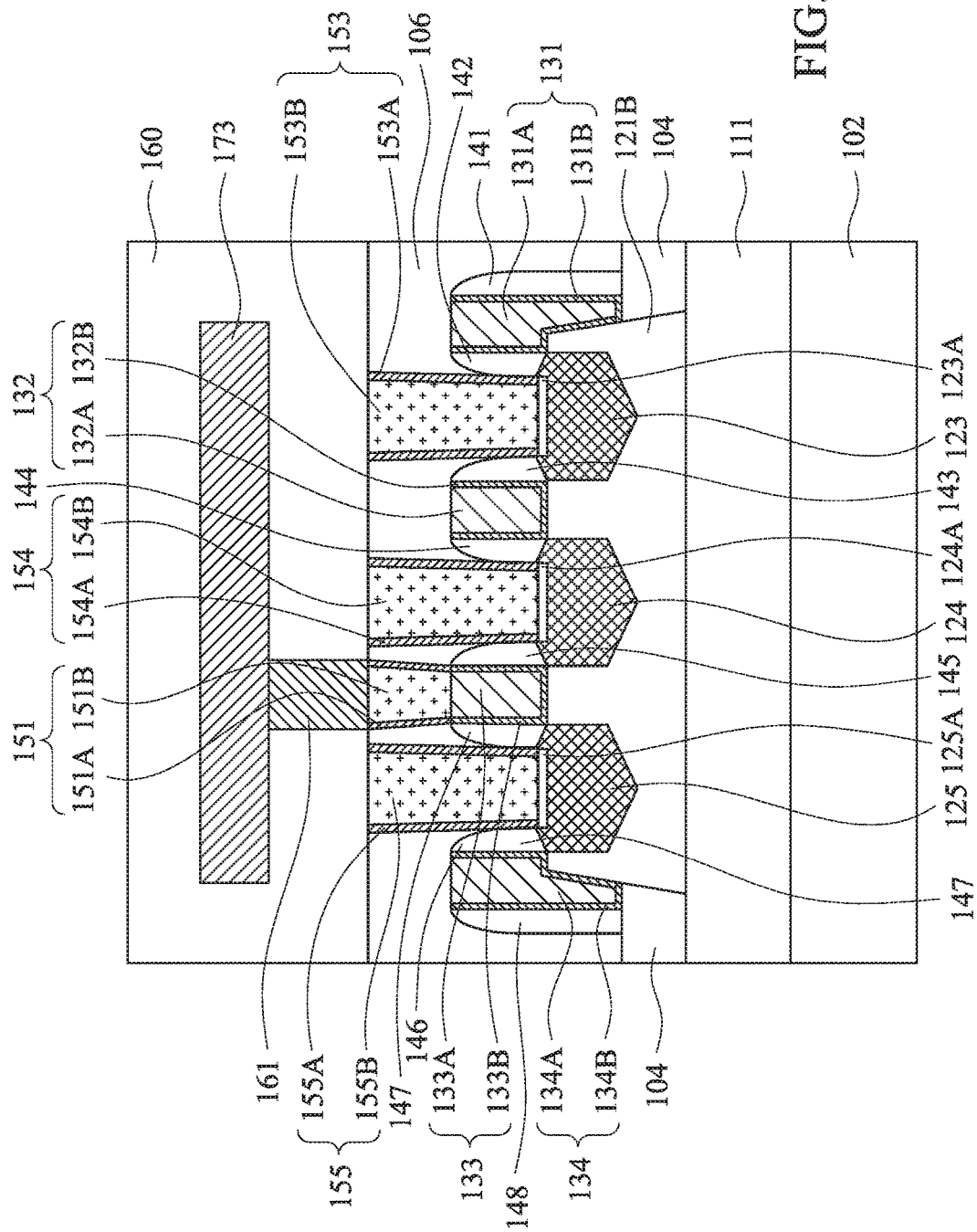
FIG. 2A to FIG. 2C are various cross-sectional views of the semiconductor device of FIG. 1.
Figure 2B:
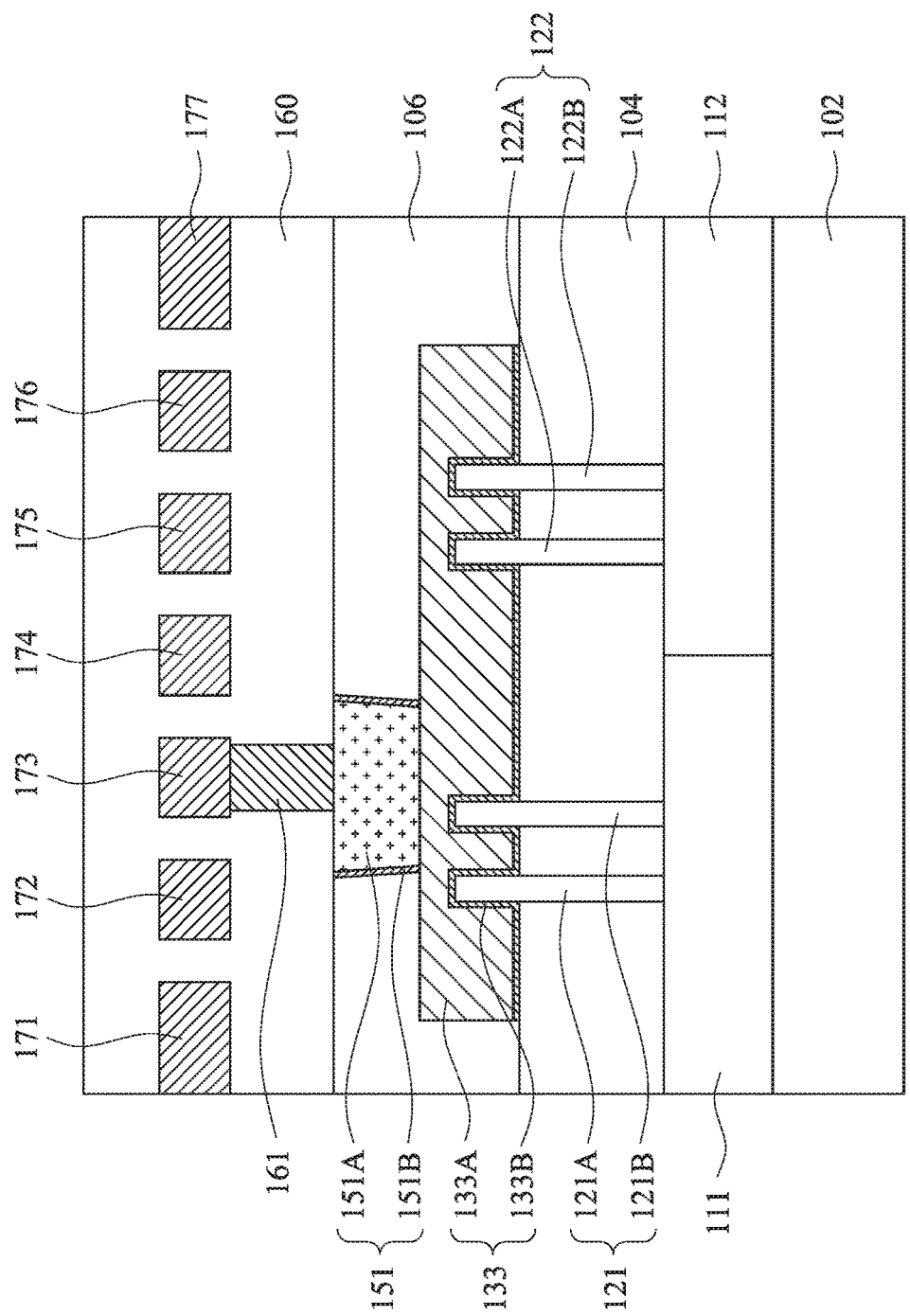
Figure 2C:
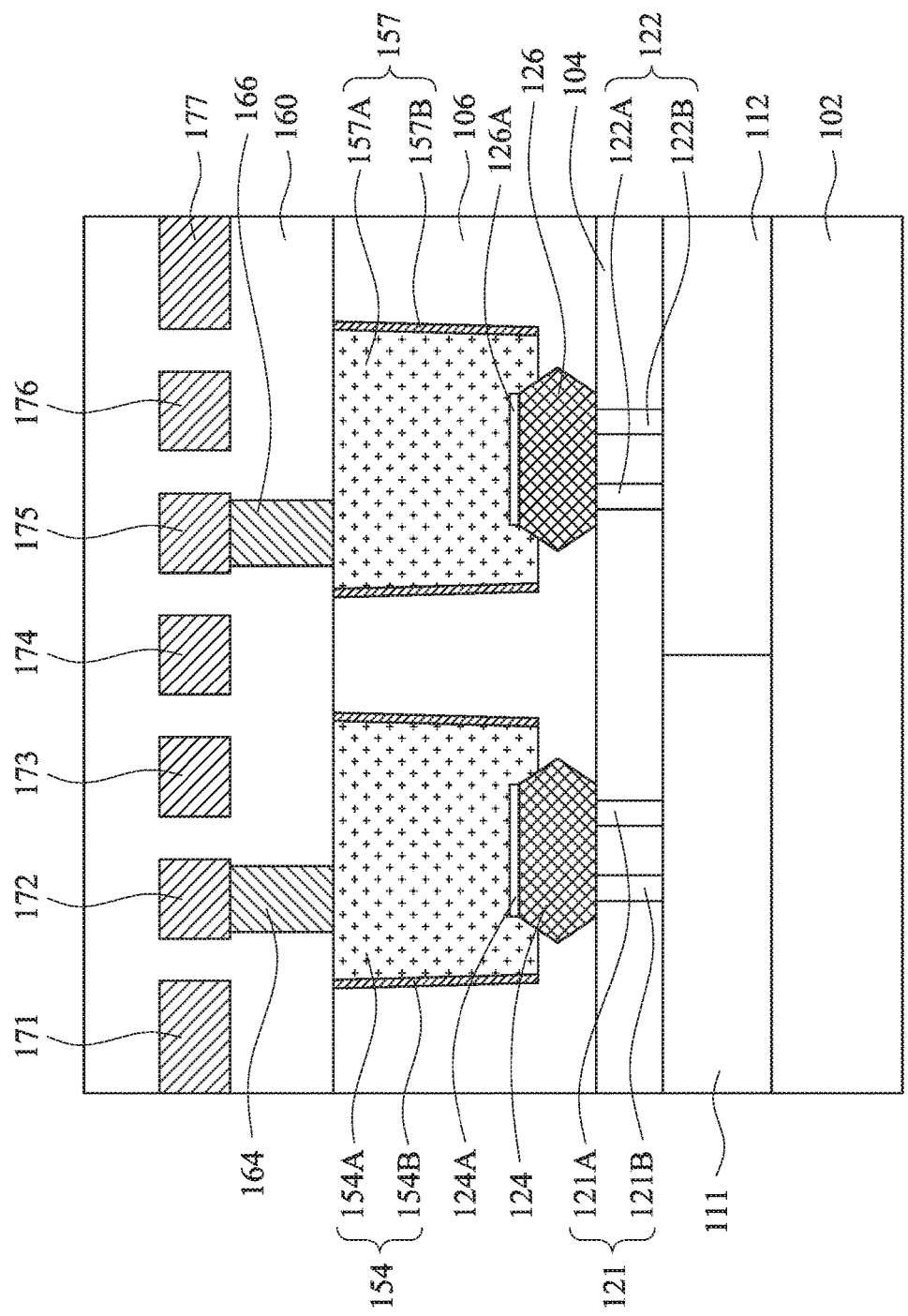

FIG. 2A to FIG. 2C are cross sectional views of the semiconductor device 100 of FIG. 1. The cross sectional views of FIG. 2A to FIG. 2C is taken along lines A-A', B-B' and C-C' of FIG. 1, respectively. In FIG. 1, the line A-A' extends along the Y direction and crossing the fin 121B, the line B-B' extends along the X direction and crossing the gate 133, and the line C-C' extends along the X direction and crossing the portions of the first well region 111 and the second well region 112 between the gates 132 and 133.

As illustrated in FIG. 2A to FIG. 2C, the semiconductor device 100 includes a substrate 102 over which various elements of the semiconductor device 100 are arranged. The elements of the semiconductor device 100 include active elements and/or passive elements. In one or more embodiments, active elements are arranged in a circuit region of the semiconductor device 100 to provide one or more functions and/or operations. In one or more embodiments, the semiconductor device 100 further includes a non-circuit region, e.g., a sealing region that surrounds the circuit region for protecting the elements in the circuit region. Examples of the active elements may be, but are not limited to, transistors and/or diodes. Examples of passive elements may be, but are not limited to, resistors, capacitors, inductors and/or fuses. Metal lines and conductive vias may be formed over the substrate 102 to electrically couple the elements of the semiconductor device 100 with each other and/or with external devices. The substrate 102 may be, for example, a silicon-on-insulator (SOI) substrate including silicon or silicon germanium, a bulk silicon substrate, a silicon substrate including silicon germanium, gallium arsenic, P-type doped silicon, N-type doped silicon, a substrate having III-VI material, or another suitable substrate. In some embodiments, the substrate 102 further includes one or more other features, such as various doped regions, a buried layer, and/or an epitaxial layer. In some embodiments, the substrate 102 includes a doped epitaxial layer, a gradient semiconductor layer, and/or a semiconductor layer overlying another semiconductor layer of different type. In some examples, the substrate 102 includes a silicon germanium layer and a silicon layer lying on the silicon germanium layer.

As shown in FIG. 2B and FIG. 2C, the first well region 111 and the second well region 112 are over the substrate 102. The first well region 111 and the second well region 112 may be an N-well region and a P-well region, respectively, or a P-well region and an N-well region, respectively, depending on design requirements as is known in the art.

In some embodiments, the semiconductor device 100 further includes one or more isolation structures over and surrounding the first well regions 111 and the second well region 112. In an exemplary configuration shown in FIG. 2A and FIG. 2B, an isolation structure 104 is over the first well region 111 and the second well region 112. The isolation structure 104 electrically isolates various elements of the semiconductor device 100 from each other. For example, the isolation structure 104 electrically isolates the fins 121A and 121B in the channel region 121 from the fins 122A and 122B in the channel region 112. In some embodiments, the isolation structure 104 includes one or more shallow trench isolations (STIs). Each of the STIs may include a material such as silicon oxide, silicon dioxide, carbon doped silicon dioxide, nitrogen doped silicon dioxide, germanium doped silicon dioxide, phosphorus doped silicon dioxide, flowable oxide, combinations thereof, and/or another suitable material. In some embodiments, each of the STIs has a thickness of about 50 nm to about 200 nm.

The channel regions 121 and 122 are on the first well region 111 and the second well region 112, respectively. Each of the channel regions 121 and 122 may include one or more fins and source/drains respectively on the fins. As shown in FIG. 2A, the channel region 121 includes source/drains 123-125 which are spaced from each other. In addition, as shown in FIG. 2C, the source/drain 124 is over the fins 121A and 121B, and the channel region 122 includes a source/drain 126 over the fins 122A and 122B. In some exemplary embodiments, portions of the fins 121A and 121B are recessed to form source/drain cavities having bottom surfaces lower than top surfaces of the fins 121A and 121B, and then the source/drains 123-125 are produced by epitaxial-growing a strained material in the formed source/drain cavities. In some embodiments, the lattice constant of the strained material for producing the source/drains 123-125 is different from that of the substrate 102. The source/drain 126 and other source/drain(s) of the channel region 122 may be produced in a similar manner as described above with regard to the source/drains 123-125. Therefore, the channel regions 121 and 122 are strained or stressed to enhance carrier mobility of the semiconductor device 100. For illustration, for a PMOS device, the strained material is configured to apply a compressive stress to enhance hole mobility in at least one source/drain of the PMOS device, and for an NMOS device, the strained material is configured to apply a tensile stress to enhance electron mobility in at least one source/drain of the NMOS device. The strained material may be, for example, silicon, germanium, silicon germanium (SiGe), silicon germanium carbide (SiGeC), silicon carbide (SiC), germanium tin (GeSn), silicon germanium tin (SiGeSn), silicon phosphoric (SiP), silicon phosphoric carbide (SiPC), combinations thereof, or another suitable material. Particularly, the strained material for the PMOS device may be, for example, silicon, germanium, silicon germanium, silicon germanium carbide, combinations thereof, or another suitable material, and the strained material for the NMOS device may be, for example, silicon, silicon phosphoric, silicon carbide, silicon phosphoric carbide, combinations thereof, or another suitable material. The upper surfaces of the strained material in the source/drains 123-126 may extend upward above the top surfaces of the channel regions 121 and 122. In other embodiments, the upper surfaces of the strained material in the source/drains 123-126 and/or the other source/drains of the semiconductor device 100 are lower than the top surface of the channel regions 121 and 122. In certain embodiments, as shown in FIG. 2A and FIG. 2C, silicate layers 123A-126A are respectively on the top portions of the source/drains 123-126 for reducing electrical resistances with the overlaying source/drain contacts 153-155 and 157. Each of the silicide layers 123A-126A may have a thickness of about 30 Angstroms to about 500 Angstroms.

The gates 131-134, the spacers 141-148, the gate contact 151, the source/drain contacts 153-155 and 157, the vias 161, 164 and 166 and the metal lines 171-177 are over the isolation structure 104. In some embodiments, the gates 131-134 and/or the spacers 141-148 may be partially embedded in the isolation structure 104.

The gates 131-134 are over the isolation structure 104 and the channel regions 121 and 122. Each of the gates 131-134 includes a gate electrode and a gate dielectric. As shown in FIG. 2A, the gates 131 and 134 are at two opposite sides of the channel region 121 and 122, the gate 132 is between the source/drains 123 and 124, and the gate 133 is between the source/drains 124 and 125. The gate 131 includes a gate electrode 131A and a gate dielectric 131B surrounding the bottom and side surfaces of the gate electrode 131A, the gate 132 includes a gate electrode 132A and a gate dielectric 132B surrounding the bottom and side surfaces of the gate electrode 132A, the gate 133 includes a gate electrode 133A and a gate dielectric 133B surrounding the bottom and side surfaces of the gate electrode 133A, and the gate 134 includes a gate electrode 134A and a gate dielectric 134B surrounding the bottom and side surfaces of the gate electrode 134A.

The gate electrodes 131A-134A may include a metallic material (such as titanium, tantalum, tungsten, aluminum, molybdenum, platinum and hafnium), a metal silicide material (such as titanium silicide, tantalum silicide, tungsten silicate, molybdenum silicate, nickel silicide and cobalt silicide), a metal nitride material (such as titanium nitride, tantalum nitride, tungsten nitride, molybdenum silicate, nickel nitride and cobalt nitride), silicided metal nitride (such as titanium silicon nitride, tantalum silicon nitride and tungsten silicon nitride), refractory metals, polysilicon, combinations thereof, and/or another suitable material.

The gate dielectrics 131B-134B may include a material such as, but not limited to, silicon oxide ($SiO_2$), silicon nitride ($Si_3N_4$), silicon oxynitride (SiON), hafnium oxide ($HfO_2$), tantalum oxide ($Ta_2O_5$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), metal oxides, metal nitrides, metal silicates, transition metal-oxides, transition metal-nitrides, transition metal-silicates, oxynitrides of metals, metal aluminates, zirconium silicate, zirconium aluminate, tin oxide (SnO), zirconium oxide ($ZrO_2$), titanium oxide ($Ti_2O_5$), aluminum oxide ($Al_2O_3$), high-k dielectrics, and/or combinations thereof. Each of the gate dielectrics 131B-134B may have a thickness of about 5 Angstroms to about 150 Angstroms. In some embodiments, each of the gate dielectrics 131B-134B includes multi-layer structure of, for example, silicon oxide or silicon oxynitride with a high-k dielectric. In other embodiments, the gates 131-134 only include the gate electrodes 131A-134A, respectively, and the gate dielectrics 131B-134B are omitted.

The spacers 141-148 are over the isolation structure 104 and the channel regions 121 and 122, and are located at the opposite sides of the corresponding gates 131-134. The spacers 141-148 may partially vertically overlap with the corresponding source/drains 123-125. As shown in FIG. 2A, the spacers 142 and 143 partially vertically overlap with the source/drain 123, the spacers 144 and 145 partially vertically overlap with the source/drain 124, and the spacers 146 and 147 partially vertically overlap with the source/drain 125. In other embodiments, the spacers 141-148 and the source/drains 123-125 are non-overlapped. The spacers 141-148 may include a material such as, but not limited to, silicon nitride ($SiN_x$), silicon oxynitride (SiON) and/or silicon carbide.

The gate contact 151 is located directly on the gate 133. The gate contact 151 is spaced from the other gate contact(s) (e.g. the gate contact 152 of FIG. 1) and the source/drain contact(s) (e.g. the source/drain contacts 153-158 of FIG. 1) of the semiconductor device 100. The gate contact dielectric 151B surrounds the side surfaces of the conductive plug 151A and has a frame shape. The conductive plug 151A directly contacts the gate 133. The conductive plug 151A may include a conductive material such as, but not limited to, titanium, titanium nitride (TiN), tantalum nitride (TaN), cobalt, ruthenium, platinum, tungsten, aluminum, copper, or combinations thereof. The gate contact dielectric 151B has a dielectric constant higher than 4.9. In addition, the gate contact dielectric 151B has a thickness of about 5 angstroms to about 100 angstroms, and preferably about 5 angstroms to about 50 angstroms. The gate contact dielectric 151B may include a material such as, but not limited to, nitride-based dielectric, silicon oxynitride, metal-oxide dielectric, hafnium oxide, tantalum oxide, titanium oxide, zirconium oxide, aluminum oxide, yttrium oxide, lanthanum oxide (LaOx), or combinations thereof.

The source/drain contact 153 is located directly on the source/drain 123, the source/drain contact 154 is located directly on the source/drain 124, the source/drain contact 155 is located directly on the source/drain 125, and the source/drain contact 157 is located directly on the source/drain 126. Each of the source/drain contacts 153-155 and 157 is spaced from the other source/drain contact(s) and the gate contact(s) of the semiconductor device 100. The source/drain contact 153 includes a conductive plug 153A and a source/drain contact dielectric 153B which surrounds the side surfaces of the conductive plug 153A and has a frame shape, the source/drain contact 154 includes a conductive plug 154A and a source/drain contact dielectric 154B which surrounds the side surfaces of the conductive plug 154A and has a frame shape, the source/drain contact 155 includes a conductive plug 155A and a source/drain contact dielectric 155B which surrounds the side surfaces of the conductive plug 155A and has a frame shape, and the source/drain contact 157 includes a conductive plug 157A and a source/drain contact dielectric 157B which surrounds the side surfaces of the conductive plug 157A and has a frame shape. The conductive plugs 153A-155A and 157A directly contact the source/drains 123-126, respectively. Each of the conductive plugs 153A-155A and 157A may include a conductive material such as, but not limited to, titanium, titanium nitride, tantalum nitride, cobalt, ruthenium, platinum, tungsten, aluminum, copper, or combinations thereof. Each of the source/drain contact dielectric 153B-155B and 157B has a dielectric constant higher than 4.9. In addition, each of the source/drain contact dielectrics 153B-155B and 157B has a thickness of about 5 angstroms to about 100 angstroms, and preferably about 5 angstroms to about 50 angstroms. Each of the source/drain contact dielectrics 153B-155B and 157B may include a material such as, but not limited to, nitride-based dielectric, silicon oxynitride, metal-oxide dielectric, hafnium oxide, tantalum oxide, titanium oxide, zirconium oxide, aluminum oxide, yttrium oxide, lanthanum oxide, or combinations thereof.

The semiconductor device 100 further includes an inter-layer dielectric (ILD) layer 106 over the substrate 102, the isolation structure 104, the first well region 111, the second well region 112, the fins 121A, 121B, 122A and 122B, the gates 131-134 and the spacers 141-148, and exposes the top surfaces of the gate contacts 151 and 152 and the source/drain contacts 153-158 (the gate contact 152 and the source/drain contacts 156 and 158 are not shown in FIG. 2A to FIG. 2C). The ILD layer 106 has a dielectric constant less than the dielectric constants of the gate contact dielectric 151B and source/drain contact dielectrics 153B-155B and 157B. In particular, the dielectric constant of the ILD layer 106 is less than 4.5, and preferably less than 4. The ILD layer 106 may include a material such as, but not limited to, silicon oxide, silicon nitride, silicon oxynitride, silicon carbide, silicon boron nitride (SiBN), silicon carbon boron nitride (SiCBN), or combinations thereof.

The semiconductor device 100 includes an inter-metal dielectric (IMD) layer 160 over the ILD layer 106, the gate contacts 151 and 152 and the source/drain contacts 153-158. The IMD layer 160 includes interconnects, such as the metal lines 171-177 and the vias (e.g. the vias 161-166; the vias 162, 163 and 165 are not shown in FIG. 2A to FIG. 2C), for electrically coupling the elements of the semiconductor device 100 with external devices. In some embodiments, the dielectric material of IMD layer 160 (without the interconnects in the IMD layer 160) includes a low-k dielectric material, such as silicon oxide and other suitable material of which a dielectric constant is less than that of the silicon oxide. As shown in FIG. 2A to FIG. 2C, the IMD layer 160 is over the ILD layer 106, the gate contact 151 and the source/drain contacts 153-155 and 157, and in the IMD layer 160, the via 161 electrically couple the gate contact 151 and the metal line 173, the via 164 electrically couple the source/drain contact 154 and the metal line 172, and the via 166 electrically couple the source/drain contact 157 and the metal line 175. In some embodiments, the semiconductor device 100 includes further metal lines and/or vias (e.g. of one or more metal layers different than the metal lines 171-177 and the vias 161-166) in the IMD layer 160. Each of the interconnects of the IMD layer 160 may include a conductive material such as copper, aluminum, nickel, titanium, tungsten, combinations thereof, and/or another suitable conductive material.

Figure 3A:
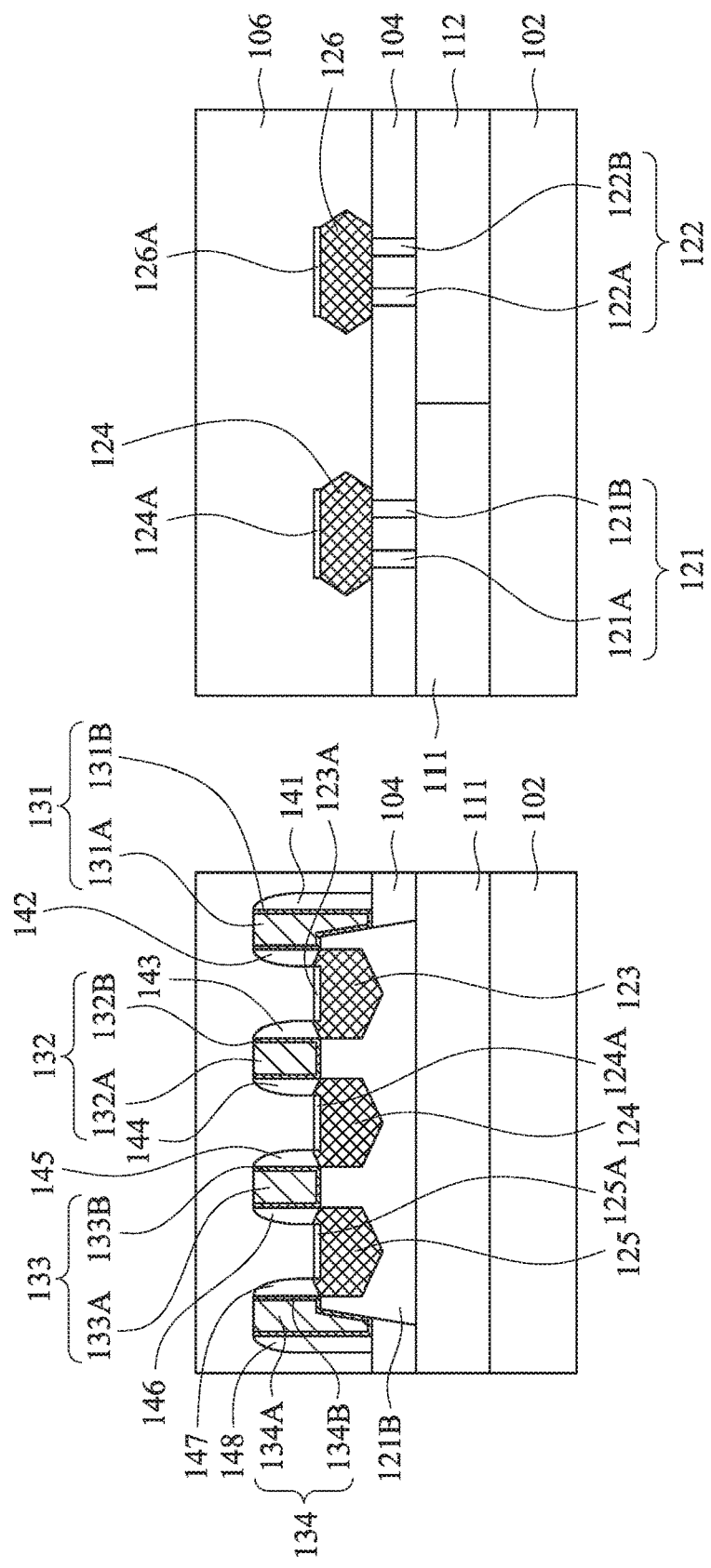
FIG. 3A(a) to FIG. 3G(b) are schematic cross-sectional views of intermediate stages in the formation of the semiconductor device of FIG. 1 in accordance with some embodiments of the present disclosure.
Figure 3B:
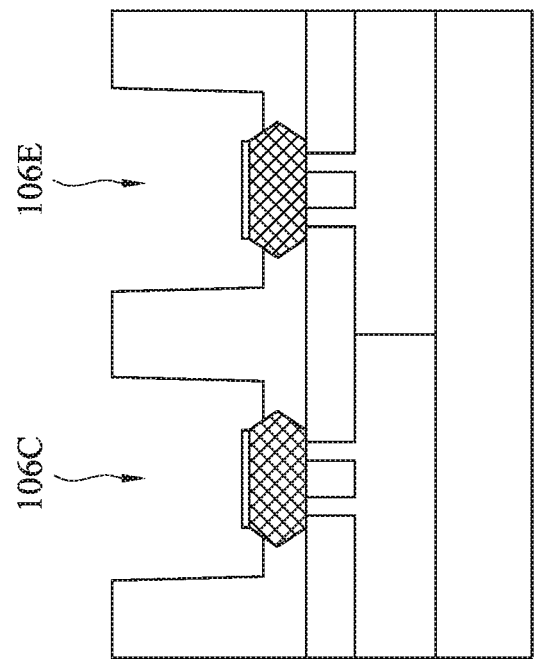
Figure 3B:
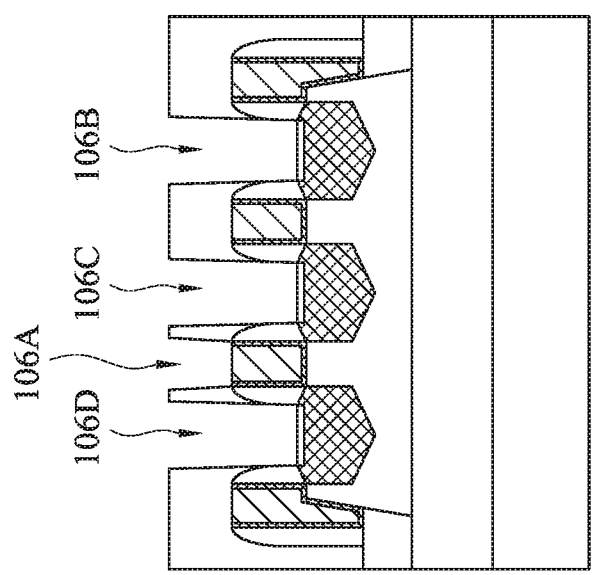
Figure 3D:
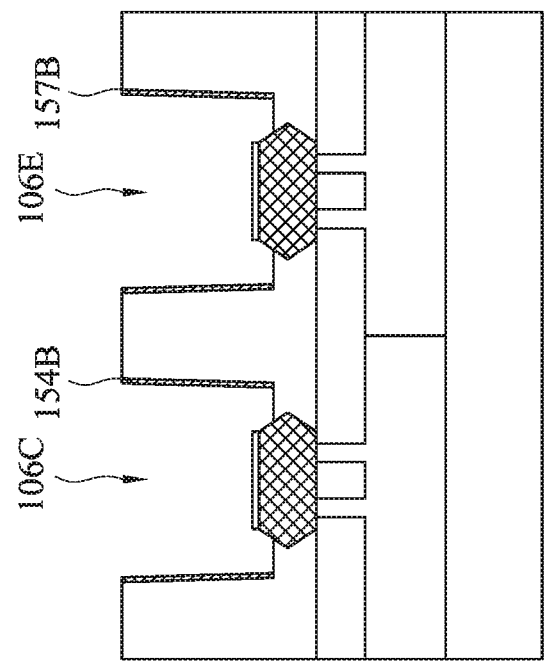
Figure 3D:
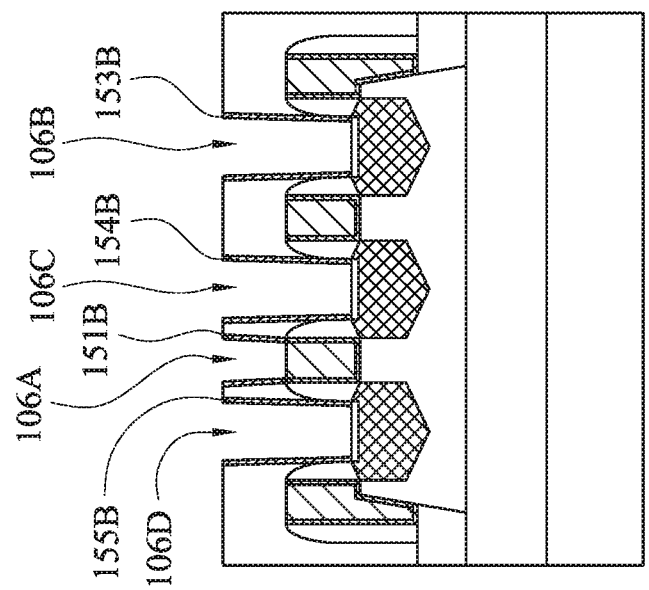
Figure 3E:
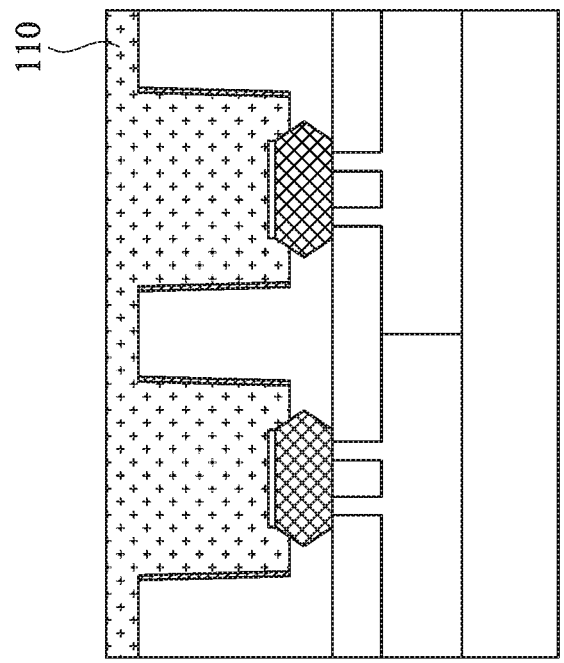
Figure 3E:
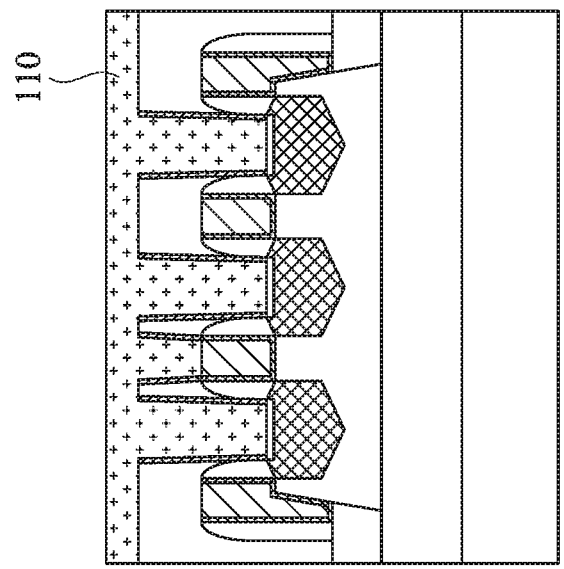
Figure 3G:
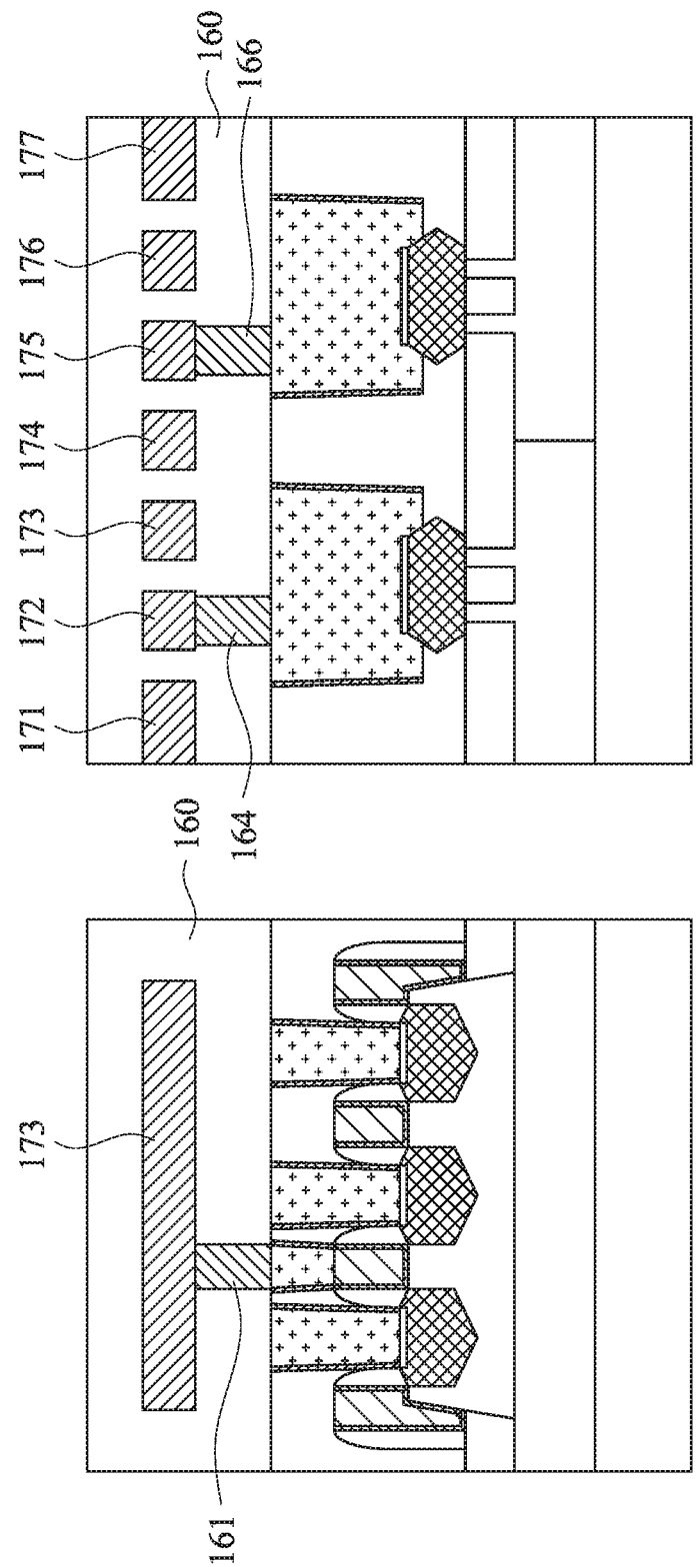

FIG. 3A(*a*) to FIG. 3G(*b*) are schematic cross-sectional views of intermediate stages in the formation of the semiconductor device 100 of FIG. 1 in accordance with some embodiments of the present disclosure. For FIG. 3A(*a*) to FIG. 3G(*b*), the first parts, i.e. FIG. 3A(*a*) to FIG. 3G(*a*), are schematic cross-sectional views of intermediate stages in the formation of the semiconductor device 100 taken along the line A-A', and the second parts FIG. 3A(*b*) to FIG. 3G(*b*), are schematic cross-sectional views of intermediate stages in the formation of the semiconductor device 100 taken along the line C-C'.

In FIG. 3A(*a*) and FIG. 3A(*b*), a first well region 111 and a second well region 112 are formed in a substrate 102. The substrate 102 may be, for example, an SOI substrate including silicon or silicon germanium, a bulk silicon substrate, a silicon substrate including silicon germanium, gallium arsenic, P-type doped silicon, N-type doped silicon, a substrate having III-VI material, or another suitable substrate. In some embodiments, the substrate 102 includes a doped epitaxial layer, a gradient semiconductor layer, and/or a semiconductor layer overlying another semiconductor layer of different type. In some examples, the substrate 102 includes a silicon germanium layer and a silicon layer lying on the silicon germanium layer. The first well region 111 and the second well region 112 may be formed by using one or more ion implantation processes. In some embodiments, the first well region 111 of N-type and the second well region 112 of P-type are formed by doping the substrate 102 with corresponding P-type and N-type dopants. In some embodiments, the first well region 111 of N-type and the second well region 112 of P-type are formed by doping the substrate 102 with corresponding P-type and N-type dopants using one or more ion implantation processes. The P-type dopants may include, but are not limited to, boron or boron fluoride ($BF_2$). The N-type dopants may include, but are not limited to, phosphorus and arsenic.

Channel regions 121 and 122 are formed over the first well region 111 and the second well region 112, respectively. The channel regions 121 and 122 may be formed including a semiconductor material such as, but not limited to, silicon, germanium and compound semiconductor, and may be doped with various types of P-type dopants and/or N-type dopants. The channel regions 121 and 122 may be formed by one or more processes, such as ion implantation processes, diffusion processes and/or another suitable process. In some embodiments, the channel region 121 on the first well region 111 of N-type is doped with P-type dopants, while the channel region 122 on the second well region 112 of P-type is doped with N-type dopants. In other embodiments, the channel region 121 on the first well region 111 of N-type is doped with P-type dopants, while the channel region 122 on the second well region 112 of P-type is doped with N-type dopants.

As shown in FIG. 3A(b), the channel region 121 includes fins 121A and 121B, and the active 122 includes fins 122A and 122B. The fins 121A, 121B, 122A and 122B may be formed by one or more suitable processes including, but not limited to, deposition, photolithography, and/or etching processes. In some exemplary examples, the fins 121A, 121B, 122A and 122B are formed by patterning and etching a portion of the substrate 102. In other exemplary examples, the fins 121A, 121B, 122A and 122B are formed by patterning and etching a silicon layer deposited overlying an insulator layer. In various embodiments, different numbers of fins may be formed in the channel regions 121 and 122. In certain embodiments, the channel regions 121 and 122 are configured for forming planar MOSFET transistors, and no fins are formed in the channel region 121 or 122.

An isolation structure 104 is formed over the first well region 111 and the second well region 112. In some embodiments, the isolation structure 104 is formed by such as a chemical vapor deposition (CVD) process, a sub-atmospheric pressure CVD (SACVD) process, a high density plasma CVD (HDPCVD) process, a high aspect ratio process (HARP), and/or another suitable process. In certain embodiments, a chemical mechanical polishing (CMP) process may be performed to planarize the upper surface of the STI 114. The isolation structure 104 may be formed including one or more STIs. In the case of STI, the isolation structure 104 may be formed including a material such as silicon oxide, silicon dioxide, carbon doped silicon dioxide, nitrogen doped silicon dioxide, germanium doped silicon dioxide, phosphorus doped silicon dioxide, flowable oxide, combinations thereof, and/or another suitable material, and having a thickness of about 50 nm to about 200 nm. In some embodiments, the isolation structure 104 is formed having multiple layers, such as a thermal oxide liner layer filled with silicon nitride or silicon oxide.

Gates 131-134 are formed over the isolation structure 104 and the channel regions 121 and 122. Each of the gates 131-134 is formed including a gate electrode and a gate dielectric. As shown in FIG. 3A(a), the gate 131 is formed including a gate electrode 131A and a gate dielectric 131B surrounding the bottom and side surfaces of the gate electrode 131A, the gate 132 is formed including a gate electrode 132A and a gate dielectric 132B surrounding the bottom and side surfaces of the gate electrode 132A, the gate 133 is formed including a gate electrode 133A and a gate dielectric 133B surrounding the bottom and side surfaces of the gate electrode 133A, and the gate 134 is formed including a gate electrode 134A and a gate dielectric 134B surrounding the bottom and side surfaces of the gate electrode 134A. In other embodiments, the gate electrodes 131A-134A are formed directly contacting the channel regions 121 and 122 and/or the isolation structure 104, and none of the gate dielectrics 131B-134B is formed. A further chemical mechanical polishing (CMP) process may be performed to planarize the gates 131-134 and remove unwanted portions of the gates 131-134.

As shown in FIG. 3A(a) and FIG. 3A(b), The gate dielectrics 131B and 134B are formed on the isolation structure 104 and two opposite sides of the channel region 121, and the gate dielectrics 132B and 133B are formed on two portions of the top surface of the channel region 121. The gate dielectrics 131B-134B may be formed by a processes including, but not limited to, a CVD process, an atomic layer deposition (ALD) process, a plasma enhanced CVD (PECVD) process, an HDPCVD process, a spin-on coating process, a sputtering process, and/or combinations thereof. Each of the gate dielectrics 131B-134B may be formed having a thickness of about 5 Angstroms to about 150 Angstroms. The gate dielectrics 131B-134B may be formed including a material such as, but not limited to, silicon oxide, silicon nitride, silicon oxynitride, hafnium oxide, tantalum oxide, hafnium silicon oxide, hafnium silicon oxynitride, hafnium tantalum oxide, hafnium titanium oxide, hafnium zirconium oxide, metal oxides, metal nitrides, metal silicates, transition metal-oxides, transition metal-nitrides, transition metal-silicates, oxynitrides of metals, metal aluminates, zirconium silicate, zirconium aluminate, tin oxide, zirconium oxide ($ZrO_2$), titanium oxide, aluminum oxide, high-k dielectrics, and/or combinations thereof. In some embodiment, each of the gate dielectrics 131B-134B is formed including multi-layer structure of, for example, silicon oxide or silicon oxynitride with a high-k dielectric.

The gate electrodes 131A-134A are formed in the spaces defined by the gate dielectrics 131B-134B, respectively. The gate electrodes 131A-134A may be formed by using one or more processes including, but not limited to, a physical vapor deposition (PVD) process, a CVD process, a low-pressure CVD (LPCVD) process, an ALD process, a spin-on deposition process, a plating process, and/or combinations thereof. The gate electrodes 131A-134A may be formed including a metallic material (such as titanium, tantalum, tungsten, aluminum, molybdenum, platinum and hafnium), a metal silicide material (such as titanium silicide, tantalum silicide, tungsten silicate, molybdenum silicate, nickel silicide and cobalt silicide), a metal nitride material (such as titanium nitride, tantalum nitride, tungsten nitride, molybdenum silicate, nickel nitride and cobalt nitride), silicided metal nitride (such as titanium silicon nitride, tantalum silicon nitride and tungsten silicon nitride), refractory metals, polysilicon, combinations thereof, and/or another suitable material.

Spacers 141-148 are formed over the isolation structure 104 and the channel regions 121 and 122, and are formed at the opposite sides of the corresponding gates 131-134, for electrically insulating the gates 131-134 from each other. The spacers 141 and 142 are formed at two opposite sides of the gate 131, the spacers 143 and 144 are formed at two opposite sides of the gate 132, the spacers 145 and 146 are formed at two opposite sides of the gate 133, and the spacers 147 and 148 are formed at two opposite sides of the gate 134. The spacers 141-148 are formed spaced from each other. The spacers 141-148 may be formed by using one or more processes such as, but not limited to, a deposition process, a lithography process, an etching process, and/or combinations thereof. The spacers 141-148 may be formed include a material such as, but not limited to, silicon nitride, silicon oxynitride and/or silicon carbide.

As shown in FIG. 3A(a) and FIG. 3A(b), source/drains 123-125 are formed in several portions of the channel region 121 and over the fins 121A and 121B and the isolation structure 104, and a source/drain 126 is formed in a portion of the channel region 122 and over the fins 122A and 122B and the isolation structure 104. In some exemplary embodiments, portions of the fins 121A, 121B, 122A and 122B are recessed to form source/drain cavities having bottom surfaces lower than top surfaces of the fins 121A, 121B, 122A and 122B, and then the source/drains 123-126 are formed by epitaxial-growing a strained material in the formed source/drain cavities by performing one or more processes, such as low pressure CVD (LPCVD) processes. The strained material for forming the source/drains 123-126 may include such as, but not limited to, silicon germanium, silicon germanium carbide, silicon carbide, germanium tin, silicon germanium tin, silicon phosphoric, silicon phosphoric carbide, and/or combinations thereof. Particularly, the strained material for the PMOS device may be, for example, silicon, germanium, silicon germanium, silicon germanium carbide, combinations thereof, or another suitable material, and the strained material for the NMOS device may be, for example, silicon, silicon phosphoric, silicon carbide, silicon phosphoric carbide, combinations thereof, or another suitable material. In some embodiments, the lattice constant of the strained material for producing the source/drains 123-126 is different from that of the substrate 102, and thus the channel regions 121 and 122 are strained or stressed to enhance carrier mobility of the semiconductor device 100. For illustration, for a PMOS device, the strained material is configured to apply a compressive stress to enhance hole mobility in at least one source/drain of the PMOS device, and for an NMOS device, the strained material is configured to apply a tensile stress to enhance electron mobility in at least one source/drain of the NMOS device. The upper surfaces of the strained material in the source/drains 123-126 may be formed extending upward above the top surfaces of the channel regions 121 and 122.

In FIG. 3A(a), the source/drains 123-125 are formed in the channel region 121; the source/drain 123 is formed between the gates 131 and 132, the source/drains 124 is formed between the gates 132 and 133, and the source/drains 125 is formed between the gates 133 and 134. The source/drains 123-125 may be formed partially vertically overlapping with the corresponding the spacers 142-147. As shown in FIG. 3A(a), the source/drain 123 is formed vertically overlapping with the spacers 142 and 143, the source/drain 124 is formed vertically overlapping with the spacers 144 and 145, and the source/drain 125 is formed vertically overlapping with the spacers 146 and 147. In other embodiments, the spacers 141-148 and the source/drains 123-125 are non-overlapped.

In certain embodiments, silicide layers may be respectively formed on the source/drains of the semiconductor device 100. As shown in FIG. 3A(a) and FIG. 3A(b), silicide layers 123A-126A are formed on the source/drains 123-126, respectively. The silicide layers 123A-126A may be formed by a blanket deposition process to an appropriate metal layer and a following annealing process in which the metal reacts with the underlying exposed silicon. The silicide layers 123A-126A may be formed having a material such as, but not limited to, cobalt, nickel, platinum, palladium, vanadium, titanium, tantalum, ytterbium, zirconium, and/or combinations thereof. Each of the silicide layers 123A-126A may be formed having a thickness of about 30 Angstroms to about 500 Angstroms.

An ILD layer 106 is formed over the, the isolation structure 104, the channel regions 121 and 122, the gates 131-134 and the spacers 141-148. The ILD layer 106 may be formed having a dielectric constant less than 4.5, and preferably less than 4. The ILD layer 106 may be formed by a process including, for example, a PECVD process, an LPCVD process, an HDPCVD process, a sub-atmospheric pressure CVD (SACVD) process, an atomic layer deposition (ALD) process, a plasma enhanced ALD (PEALD) process, a monolayer deposition (MLD) process, a plasma impulse CVD (PICVD) process, a spin-on deposition process, or another suitable process. In some embodiments, a planarization process, such as a CMP process, is further performed to planarize the top surface of the ILD layer 106. The ILD layer 106 may be formed including a material such as, but not limited to, silicon oxide, silicon nitride, silicon oxynitride, silicon carbide, silicon boron nitride, silicon carbon boron nitride, or combinations thereof.

After the ILD layer 106 is formed, an etching process is then performed on the ILD layer 106 to form openings in the ILD layer 106 for exposing top surfaces of one or more of the gates and/or the source/drains of the semiconductor device 100. As shown in FIG. 3B(a) and FIG. 3B(b), portions of the ILD layer 106 above the gate 132 and the source/drains 123-126 are removed, so as to form openings 106A-106E respectively on and exposing top surfaces of one or more of the gate 131 and the source/drains 123-126. Each of the openings 106A-106E may have a strip shape of which a ratio of a length to a width is at least 2. For illustration, the ratio of the length to the width of each of the openings 106A-106E is at least 2. The etching process to the ILD layer 106 may include a dry etching process (such as a plasma etching process and a reactive ion etching process), a wet etching process (such as a chemical etching process and a liquid etching process) and/or a combination thereof.

A contact dielectric 108 is then formed over the etched ILD 106. As shown in FIG. 3C(a) and FIG. 3C(b), the contact dielectric 108 is formed over the ILD layer 106 and conformal to the openings 106A-106E. The contact dielectric 108 may be formed having a thickness of about 5 angstroms to about 100 angstroms, and preferably about 5 angstroms to about 50 angstroms. The contact dielectric 108 may be formed by a process including, but not limited to, a CVD process, an ALD process, a PECVD process, an HDPCVD process, a spin-on coating process, a sputtering process, and/or combinations thereof. The contact dielectric 108 is formed having a dielectric constant higher than 4.9. The contact dielectric 108 may be formed including a material such as, but not limited to, nitride-based dielectric, silicon oxynitride, metal-oxide dielectric, hafnium oxide, tantalum oxide, titanium oxide, zirconium oxide, aluminum oxide, yttrium oxide, lanthanum oxide, or combinations thereof.

Portions of the contact dielectric 108 outside of the sidewalls of the openings of the ILD layer 106 are removed, and the other portions of the contact dielectric 108 conformal to the sidewalls of the openings of the ILD layer 106 are remained. As shown in FIG. 3D(a) and FIG. 3D(b), the portions of the contact dielectric 108 on the top surface of the ILD 106 and at the bottoms of the openings 106A-106E are removed, and the portions of the contact dielectric 108 conformal to the sidewalls of the openings 106A-106E are remained. The portions of the contact dielectric 108 outside of the sidewalls of the openings 106A-106E may be removed by, for example, a dry etching process such as a plasma etching process, or another suitable etching process. The process parameters of the etching process may be adjusted in order to remove only the portions of the contact dielectric 108 on the top surface of the ILD 106 and at the bottoms of the openings 106A-106E with minimal removal of the portions of the contact dielectric 108 along the sidewalls of the openings 106A-106E. As shown in FIG. 3D(a) and FIG. 3D(b), the portions of the contact dielectric 108 on the top surface of the ILD 106 and at the bottoms of the openings 106A-106E are removed, and the portions of the contact dielectric 108 conformal to the sidewalls of the openings 106A-106E are remained.

After the etching process to the contact dielectric 108, gate contact dielectrics (e.g. the gate contact dielectric 151B) and source/drain contact dielectrics (e.g. the source/drain contact dielectrics 153B-155B and 157B) are formed. Then, a conductive layer 110 is formed over the ILD layer 106 and filling the openings of the ILD layer 106. As shown in FIG. 3E(a) and FIG. 3E(b), the conductive layer 110 is formed over the ILD layer 106 and filling the openings 106A-106E. The portions of the conductive layer 110 in the openings 106A-106E border the inner surfaces of the gate contact dielectric 151B and the source/drain contact dielectrics 153B-155B and 157B, respectively. The conductive layer 110 may be formed by a process including, but not limited to, a CVD process, a PVD process, a plating process, and/or combinations thereof. The conductive layer 110 may include a conductive material such as, but not limited to, titanium, titanium nitride, tantalum nitride, cobalt, ruthenium, platinum, tungsten, aluminum, copper, or combinations thereof.

After the conductive layer 110 is formed, a CMP process is performed to remove a portion of the conductive layer 110 upper to the top surface of the ILD layer 106, and the remained portions of the conductive layer 110 form conductive plugs. As shown in FIG. 3F(a) and FIG. 3F(b), the portion of the conductive layer 110 upper to the top surface of the ILD layer 106 is removed, and some of the remaining portions of the conductive layer 110 forms conductive plugs 151A, 153A-155A and 157A.

After the CMP process to the conductive layer 110, an IMD layer 160 is then formed over the ILD layer 106, the gate contact dielectrics, the source/drain contact dielectrics and the conductive plugs. The IMD layer 160 may be formed including interconnects for electrically coupling the elements of the semiconductor device 100 with external devices. The IMD layer 160 (without the interconnects in the IMD layer 160) may be formed including a low-k dielectric material, such as silicon oxide and other suitable material of which a dielectric constant is less than that of the silicon oxide. The interconnects of the IMD layer 160 may be formed including a conductive material such as copper, aluminum, nickel, titanium, tungsten, combinations thereof, and/or another suitable conductive material. The IMD layer 160 (without the interconnects in the IMD layer 160) may be formed including a low-k dielectric material, such as silicon oxide and other suitable material of which a dielectric constant is less than that of the silicon oxide. The dielectric of the IMD layer 160 may be formed by a process including. As shown in FIG. 3G(a) and FIG. 3G(b), the IMD layer 160 is formed including vias 161, 164 and 166 and metal lines 171-177.

It is noted that, although some elements are shown in FIG. 1 but are not shown in FIG. 2A to FIG. 3G(b), e.g. the gate contact 152 and its underlying gate, the source/drain contacts 156 and 158 and their underlying source/drains and the conductive vias 162, 163 and 165, these elements may be arranged and formed in a similar manner to the corresponding elements (for example, the source contact 151, the gate 133, the source/drain contact 154, the source/drain 124 and the conductive vias 161 and 164) shown in FIG. 2A to FIG. 3G(b).

Figure 4:
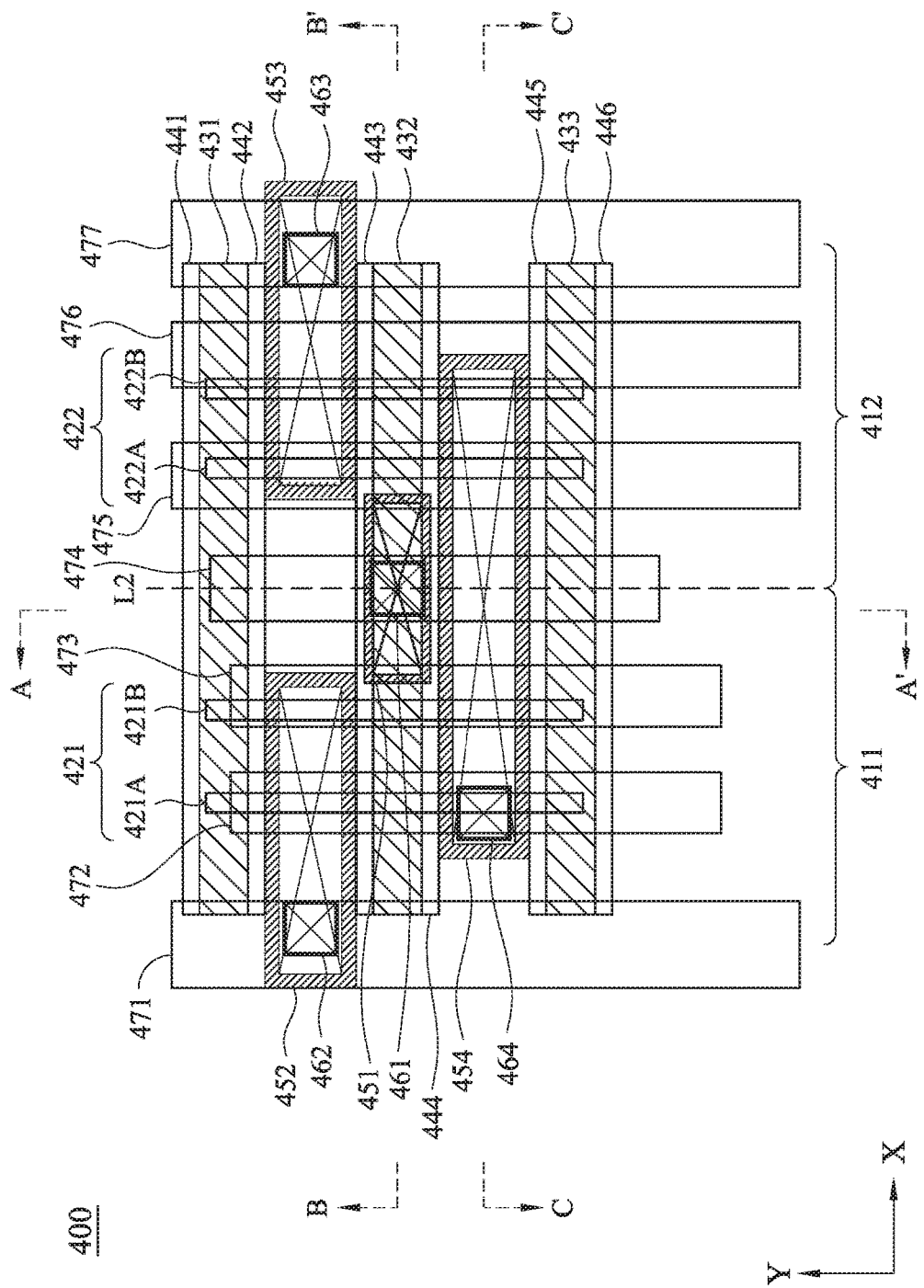
FIG. 4 is a schematic layout diagram of a semiconductor device in accordance with some embodiments of the present disclosure.

Referring to FIG. 4, FIG. 4 exemplarily illustrates a layout diagram of a semiconductor device 400 in accordance with some embodiments. As shown in FIG. 4, the semiconductor device 400 is a CMOSFET transistor device, including a first well region 411, a second well region 412, channel regions 421 and 422, gates 431-433, spacers 441-446, a gate contact 451, source/drain contacts 452-454, vias 461-464 and metal lines 471-477, in which the channel region 421, the source/drain contact 452, the vias 462 and 463 are within the area of the first well region 411, the channel region 422, the source/drain contacts 453, the via 464 are within the area of the second well region 412, the via 461 is at the boundary between the first well region 411 and the second well region 412, and the gates 431-433, the spacers 441-446, and the source/drain contact 454 extend from the first well region 411 to the second well region 412.

The first well region 411 and the second well region 412 may be, for example, an N-well region and a P-well region, respectively, or a P-well region and an N-well region, respectively. The first well region 411 and the second well region 412 are on opposite sides of an imaginary line L2 which separates the semiconductor device 400 into two semiconductor structures for different types of devices or transistors.

The channel regions 421 and 422 extend along a first horizontal direction of the semiconductor device 400, e.g., the Y direction. The channel regions 421 and 422 may include a semiconductor material such as, but not limited to, silicon, germanium and compound semiconductor, and may be doped with various types of P-type dopants and/or N-type dopants. In some embodiments, the channel region 421 is a P-type doped channel region on the first well region 411 of N-type, while the channel region 422 is an N-type doped channel region on the second well region 412 of P-type. In other embodiments, the channel region 421 is an N-type doped channel region on the first well region 411 of P-type, while the channel region 422 is a P-type doped channel region on the second well region 412 of N-type. Each of the channel regions 421 and 422 may include one or more fins as channel regions to form FinFETs, which may include 2D-FinFET structures, 3D-FinFET structures, and/or combinations thereof.

In some exemplary embodiments, as illustrated in FIG. 4, each of the channel regions 421 and 422 includes two fins. The channel region 421 includes fins 421A and 421B, and the channel region 422 includes fins 422A and 422B. The fins 421A, 421B, 422A and 422B are physically isolated. It is noted that other numbers of fins in each of the channel regions 421 and 422 are within the scope of various embodiments. For various embodiments, the channel regions 421 and 422 may include different numbers of fins. In certain embodiments, the channel regions 421 and 422 are configured for forming planar MOSFET transistors, neither of which having fins.

The gates 431-433 extend along a second horizontal direction of the semiconductor device 400, e.g., the X direction. The gates 431-433 may include, for example, polysilicon, metal, combinations thereof, and/or other suitable material. The active area regions 411 and 412 and the gate electrodes 431-433 form one or more transistors of the semiconductor device 400. In an exemplary example, the gate 432 and the channel regions 421 and 422 are configured for forming a P-type MOSFET and an N-type MOSFET, and the gates 431 and 433 are configured as dummy gates. One source/drain of the P-type MOSFET (including the gate 432) is defined by a portion of the channel region 421 on one side of the gate 432, and the other source/drain of the P-type MOSFET is defined by another region of the channel region 421 on the opposite side of the gate 432. Similarly, one source/drain of the N-type MOSFET (including the gate 432) is defined by a portion of the channel region 422 on one side of the gate 432, and the other source/drain of the N-type MOSFET is defined by another region of the channel region 422 on the opposite side of the gate 432. In some embodiments, the other source/drain of the N-type MOSFET and the other source/drain of the P-type MOSFET are physically connected to form a common source/drain. In certain embodiments, further transistors may be formed by the channel regions 421 and 422 and the gate 432. The distance between the gates 431 and 432 may be substantially the same as the distance between the gates 432 and 433.

The spacers 441-446 are arranged at opposite sides of the corresponding gates 431-433, for electrically isolating the gates 431-433. As shown in FIG. 4, the spacers 441 and 442 are arranged at two opposite sides of the gate 431, the spacers 443 and 444 are arranged at two opposite sides of the gate 432, and the spacers 445 and 446 are arranged at two opposite sides of the gate 433. In particular, the spacers 441-446 may include one or more dielectric materials for electrically isolating the corresponding gates 431-433 from unintended electrical contacts.

The gate contact 451 vertically overlaps with the corresponding gate 432. In particular, as shown in FIG. 4, the gate contact 451 extends from the first well region 411 to the second well region 412 and vertically overlaps with the gate 432. The gate contact 451 may have a ratio of a length (e.g. along the X direction) to a width (e.g. along the Y direction) may be at least 2, in order to increase the contacting area of the gate contact 451 with the gate 432. In addition, the width of the gate contact 451 may be the same as or greater than the width of the gate 432. Other arrangements of the gate contact 451 may be applied in various embodiments. For example, the gate contact 451 may extend vertically overlapping with the fin 421B of channel region 421 and/or the fin 422A of channel region 422. In further embodiments, the gate contact 451 extends vertically overlapping with the fin 421A of channel region 421 and/or the fin 422B of channel region 422.

The source/drain contacts 452-454 respectively vertically overlap with the corresponding regions of the first well region 411 and the second well region 412. In particular, as shown in FIG. 4, the source/drain contact 452 vertically overlaps with a portion of the first well region 411 between the gates 431 and 432, the source/drain contact 453 vertically overlaps with a portion of the second well region 412 between the gates 431 and 432, and the source/drain contact 454 vertically overlaps with a portion of the first well region 411 and a portion of the second well region 412 between the gates 432 and 433. As shown in FIG. 4, the source/drain contact 452 may further vertically overlap with the fins 421A and 421B of the channel region 421, the source/drain contact 453 may further vertically overlap with the fins 422A and 422B of the channel region 422, and/or the source/drain contact 454 may further vertically overlap with the fins 421A and 421B of the channel region 421 and/or the fins 422A and 422B of the channel region 422.

The gate contact 451 and the source/drain contacts 452-454 are spaced from each other. In some embodiments, one or more of gate contact 451 and the source/drain contacts 452-454 are spaced from the spacers 441-446.

Each of the portions of the first well region 411 and the second well region 412 respectively vertically overlapped with the source/drain contacts 452-454 may include a source/drain of a corresponding transistor in the first well region 411 or the second well region 412. In some embodiments, in the area of the first well region 411, the source/drain contact 452 vertically overlaps with and electrically couples one source/drain of the P-type MOSFET (including the gate 432), and the source/drain contact 454 vertically overlaps with and electrically couples the other source/drain of the P-type MOSFET, and in the area of the second well region 412, the source/drain contact 453 vertically overlaps with and electrically couples one source/drain of the N-type MOSFET (including the gate 432), and the source/drain contact 454 vertically overlaps with and electrically couples the other source/drain of the N-type MOSFET. Each of the source/drain contacts 452-454 may have a ratio of a length (e.g. along the X direction) to a width (e.g. along the Y direction) may be at least 2, in order to increase the contacting areas of the source/drain contacts 452-454 with the corresponding areas of source/drain in the first well region 411 and/or the second well region 412. In addition, the width of each of the source/drain contacts 452-454 may be the same as or greater than the distance between the corresponding neighboring ones of the spacers 442-445. For illustration, the width of source/drain contact 454 may be the same as or greater than the distance between the spacers 444 and 445. In certain embodiments, one or more of the source/drain contacts 452-454 are spaced from the spacers 441-446.

The vias 461-464 are located above and contacts the corresponding gate contact 451 and the source/drain contacts 452-454, respectively. One or more of the vias 461-464 may vertically overlap with the channel region 421 or 422. As shown in FIG. 4, the via 464 vertically overlaps with the fin 421A of the channel region 421, and each of the vias 461-463 is spaced from the channel regions 421 and 422. The via 464 may alternatively overlap with the fin 421B of the channel region 421 or the fin 422A or 422B of the channel region 422. In other embodiments, one or more of the vias 461-463 may overlap with the channel region 421 and/or 422 depending on various design requirements.

The metal lines 471-477 are arranged along the Y direction and vertically overlapping with the gates 431-433. The metal lines 471-477 may be used for electrically coupling the conductive elements of the semiconductor device 400 with external devices. As shown in FIG. 4, the metal line 471 is arranged overlapping with and electrically coupling the via 462 and the source/drain contact 452, the metal line 472 is arranged overlapping with and electrically coupling the via 464 and the source/drain contact 454, the metal line 474 is arranged overlapping with and electrically coupling the via 461 and the gate contact 451, and the metal line 475 is arranged overlapping with and electrically coupling the via 463 and the source/drain contact 453. The arrangements of the vias 461-464 for electrically coupling the gate contact 451, the source/drain contacts 452-454 and the metal lines 471-477 may be modified depending on various design requirements.

Figure 5A:
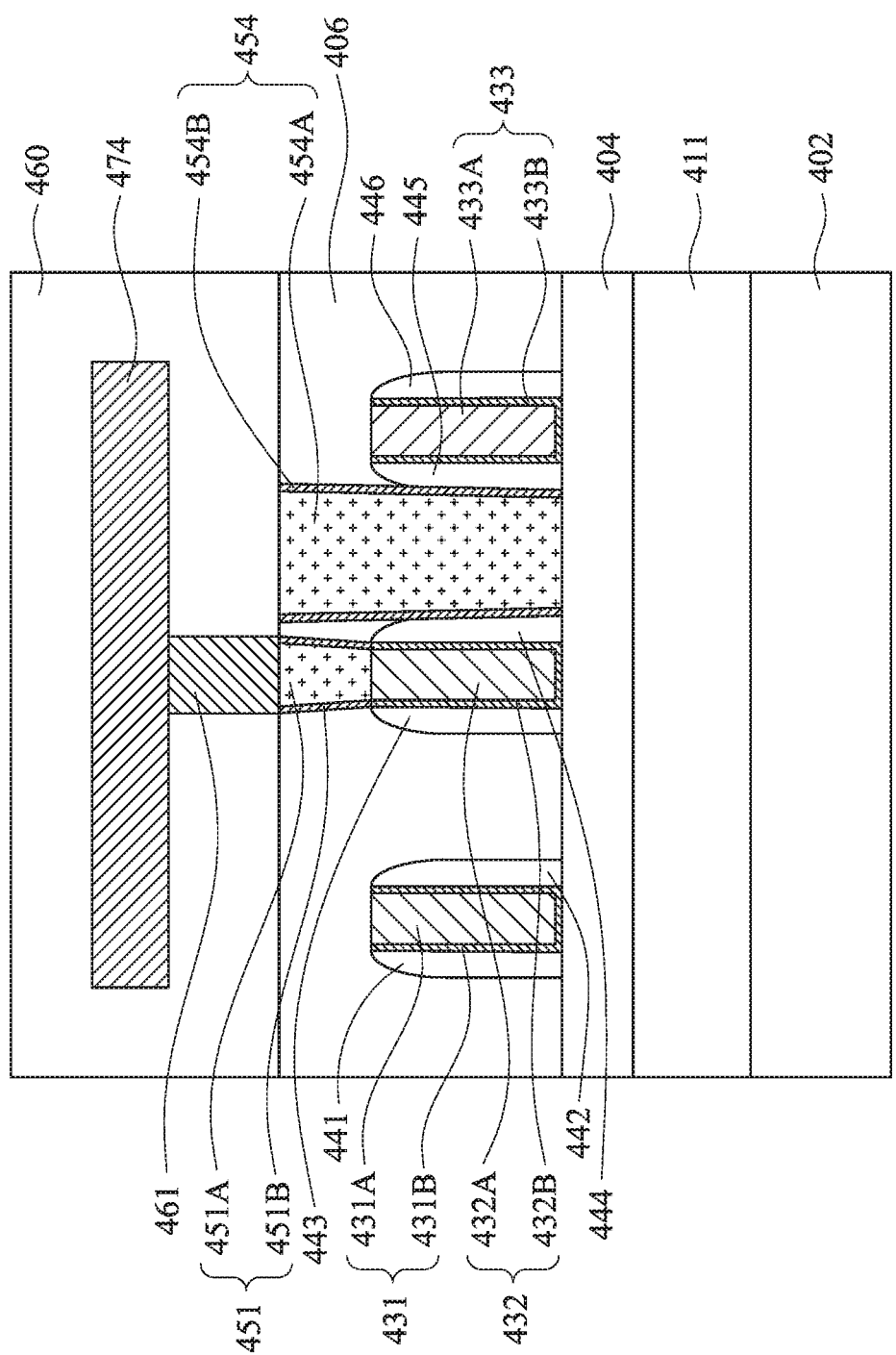
FIG. 5A to FIG. 5C are various cross-sectional views of the semiconductor device of FIG. 4.
Figure 5B:
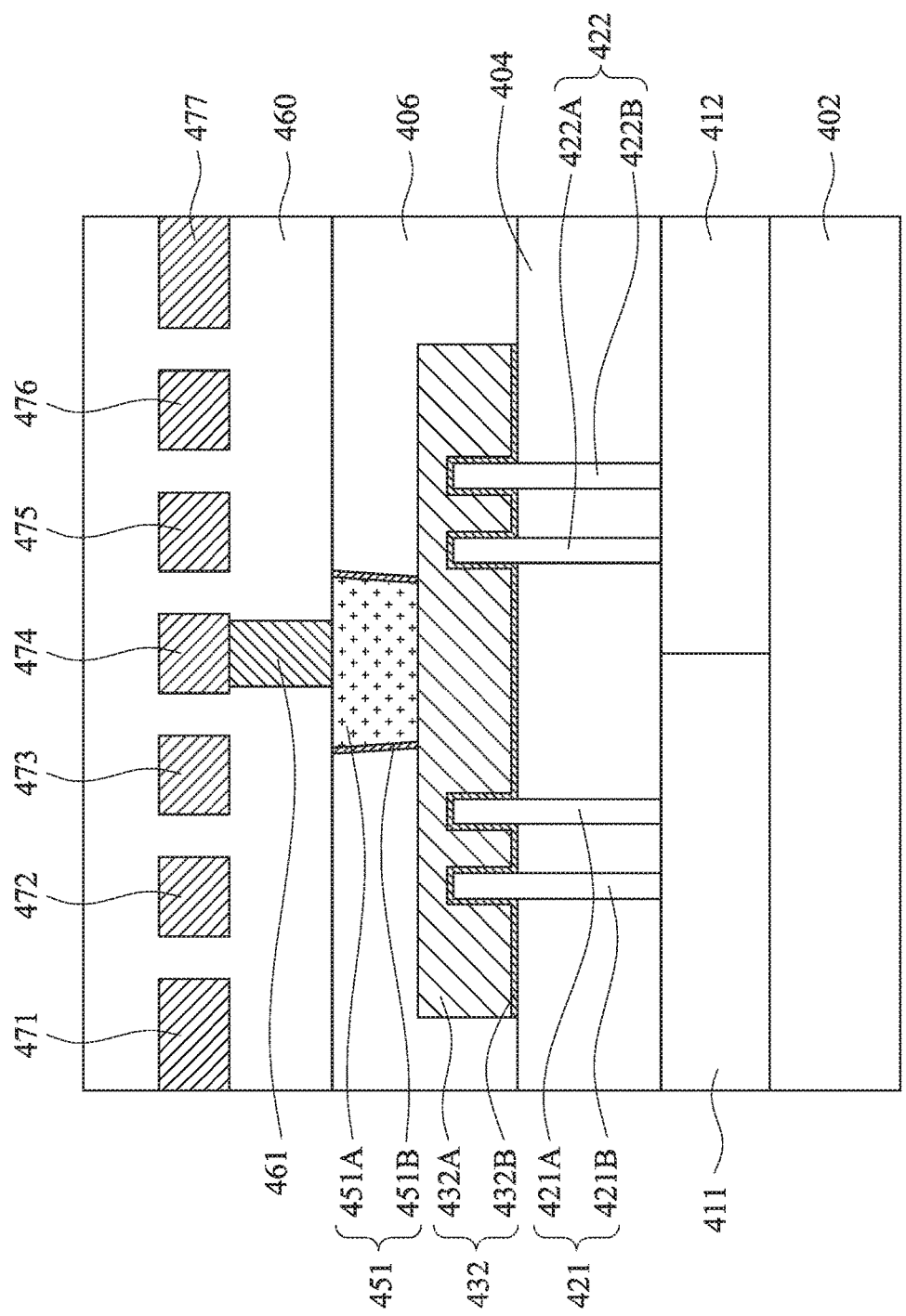
Figure 5C:
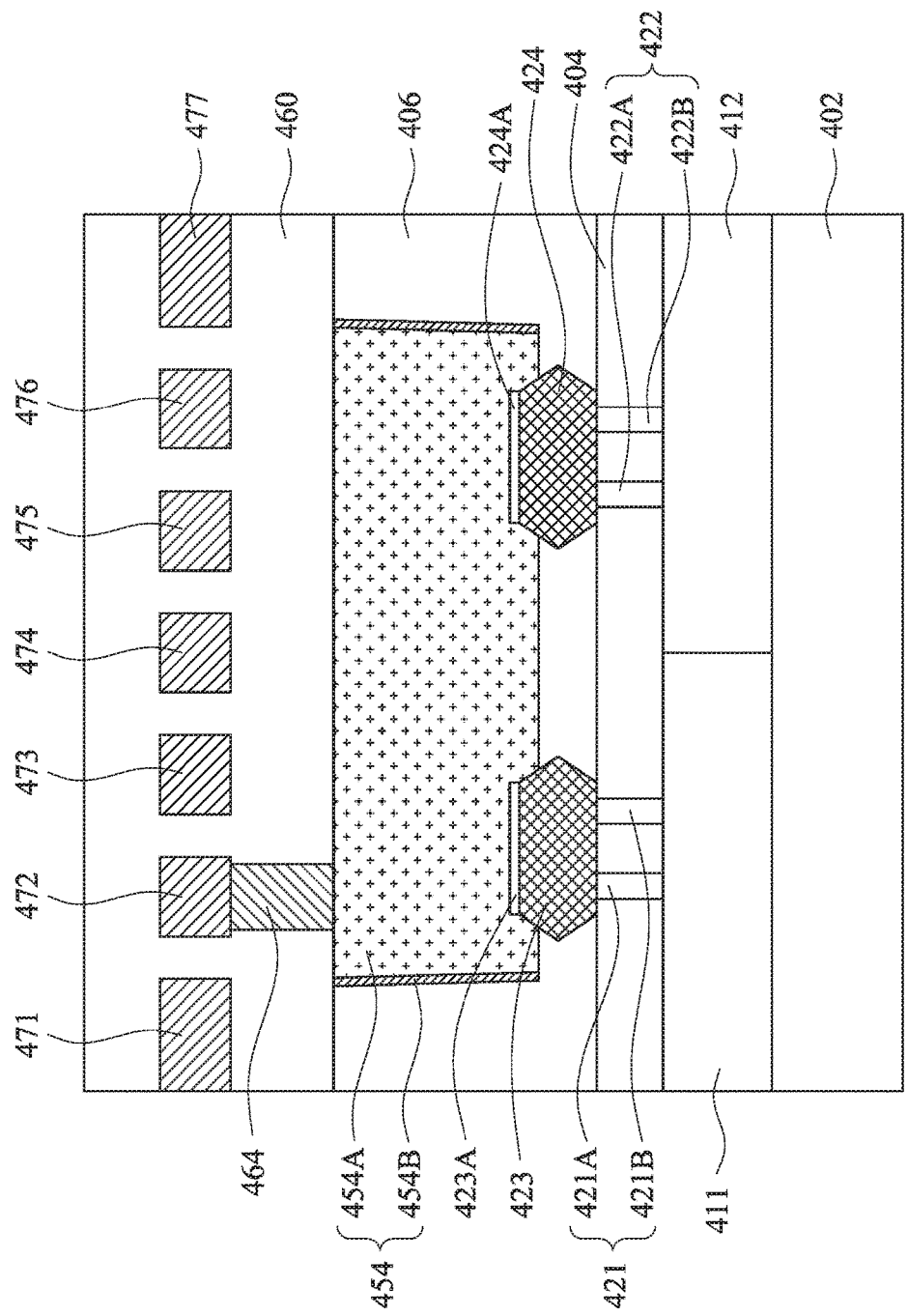

FIG. 5A to FIG. 5C are cross sectional views of the semiconductor device 400 of FIG. 4. The cross sectional views of FIG. 5A to FIG. 5C is taken along lines A-A', B-B' and C-C' of FIG. 4, respectively. In FIG. 5, the line A-A' extends along the Y direction and crossing the metal line 474, the line B-B' extends along the X direction and crossing the gate 432, and the line C-C' extends along the X direction and crossing the portions of the first well region 411 and the second well region 412 between the gates 432 and 433.

As illustrated in FIG. 5A to FIG. 5C, the semiconductor device 400 includes a substrate 402 over which various elements of the semiconductor device 400 are arranged. The elements of the semiconductor device 400 include active elements and/or passive elements. In one or more embodiments, active elements are arranged in a circuit region of the semiconductor device 400 to provide one or more functions and/or operations. In one or more embodiments, the semiconductor device 400 further includes a non-circuit region, e.g., a sealing region that surrounds the circuit region for protecting the elements in the circuit region. Examples of the active elements may be, but are not limited to, transistors and/or diodes. Examples of passive elements may be, but are not limited to, resistors, capacitors, inductors and/or fuses. Metal lines and conductive vias may be formed over the substrate 402 to electrically couple the elements of the semiconductor device 400 with each other and/or with external devices. The substrate 402 may be, for example, an SOI substrate including silicon or silicon germanium, a bulk silicon substrate, a silicon substrate including silicon germanium, gallium arsenic, P-type doped silicon, N-type doped silicon, a substrate having III-VI material, or another suitable substrate. In some embodiments, the substrate 402 further includes one or more other features, such as various doped regions, a buried layer, and/or an epitaxial layer. In some embodiments, the substrate 402 includes a doped epitaxial layer, a gradient semiconductor layer, and/or a semiconductor layer overlying another semiconductor layer of different type. In some examples, the substrate 402 includes a silicon germanium layer and a silicon layer lying on the silicon germanium layer.

As shown in FIG. 5B and FIG. 5C, the first well region 411 and the second well region 412 are over the substrate 402. The first well region 411 and the second well region 412 may be an N-well region and a P-well region, respectively, or a P-well region and an N-well region, respectively, depending on design requirements as is known in the art.

In some embodiments, the semiconductor device 400 further includes one or more isolation structures over and surrounding the first well regions 411 and the second well region 412. In an exemplary configuration shown in FIG. 5A and FIG. 5B, an isolation structure 404 is over the first well region 411 and the second well region 412. The isolation structure 404 electrically isolates various elements of the semiconductor device 400 from each other. For example, the isolation structure 404 electrically isolates the fins 421A and 421B in the channel region 421 from the fins 422A and 422B in the channel region 412. In some embodiments, the isolation structure 404 includes one or more STIs. Each of the STIs may include a material such as silicon oxide, silicon dioxide, carbon doped silicon dioxide, nitrogen doped silicon dioxide, germanium doped silicon dioxide, phosphorus doped silicon dioxide, flowable oxide, combinations thereof, and/or another suitable material. In some embodiments, each of the STIs has a thickness of about 50 nm to about 200 nm.

The channel regions 421 and 422 are on the first well region 411 and the second well region 412, respectively. Each of the channel regions 421 and 422 may include one or more fins and source/drains respectively on the fins. In addition, as shown in FIG. 5C, the channel region 421 includes a source/drain 423 over the fins 421A and 421B, and the channel region 422 includes a source/drain 424 over the fins 422A and 422B. In some exemplary embodiments, portions of the fins 421A and 421B are recessed to form source/drain cavities having bottom surfaces lower than top surfaces of the fins 421A and 421B, and then the source/drains 423-424 are produced by epitaxial-growing a strained material in the formed source/drain cavities. In some embodiments, the lattice constant of the strained material for producing the source/drain 423 is different from that of the substrate 402. The source/drain 424 and other source/drain(s) of the channel region 422 may be produced in a similar manner as described above with regard to the source/drain 423. Therefore, the channel regions 421 and 422 are strained or stressed to enhance carrier mobility of the semiconductor device 400. For illustration, for a PMOS device in the area of the first well region 411 of N-type, the strained material is configured to apply a compressive stress to enhance hole mobility in at least one source/drain of the PMOS device, and for an NMOS device in the area of the second well region 412 of P-type, the strained material is configured to apply a tensile stress to enhance electron mobility in at least one source/drain of the NMOS device. The strained material may be, for example, silicon germanium, silicon germanium carbide, silicon carbide, germanium tin, silicon germanium tin, silicon phosphoric, silicon phosphoric carbide, combinations thereof, or another suitable material. Particularly, the strained material for the PMOS device may be, for example, silicon, germanium, silicon germanium, silicon germanium carbide, combinations thereof, or another suitable material, and the strained material for the NMOS device may be, for example, silicon, silicon phosphoric, silicon carbide, silicon phosphoric carbide, combinations thereof, or another suitable material. The upper surfaces of the strained material in the source/drains 423-424 may extend upward above the top surfaces of the channel regions 421 and 422. In other embodiments, the upper surfaces of the strained material in the source/drains 423-424 and/or the other source/drains of the semiconductor device 400 are lower than the top surface of the channel regions 421 and 422. In certain embodiments, as shown in FIG. 5C, silicate layers 423A and 424A are respectively on the top portions of the source/drains 423 and 424 for reducing electrical resistances with the overlaying source/drain contact 454. Each of the silicide layers 423A and 424A may have a thickness of about 30 Angstroms to about 500 Angstroms.

The gates 431-433, the spacers 441-446, the gate contact 451, the source/drain contact 454, the vias 461 and 464 and the metal lines 471-477 are over the isolation structure 404. In some embodiments, the gates 431-433 and/or the spacers 441-446 may be partially embedded in the isolation structure 404.

The gates 431-433 are over the isolation structure 404 and the channel regions 421 and 422. Each of the gates 431-433 includes a gate electrode and a gate dielectric. As shown in FIG. 5A, the gates 431 and 433 are on three different portions of the isolation structure 404, respectively. The gate 431 includes a gate electrode 431A and a gate dielectric 431B surrounding the bottom and side surfaces of the gate electrode 431A, the gate 432 includes a gate electrode 432A and a gate dielectric 432B surrounding the bottom and side surfaces of the gate electrode 432A, and the gate 433 includes a gate electrode 433A and a gate dielectric 433B surrounding the bottom and side surfaces of the gate electrode 433A.

The gate electrodes 431A-433A may include a metallic material (such as titanium, tantalum, tungsten, aluminum, molybdenum, platinum and hafnium), a metal silicide material (such as titanium silicide, tantalum silicide, tungsten silicate, molybdenum silicate, nickel silicide and cobalt silicide), a metal nitride material (such as titanium nitride, tantalum nitride, tungsten nitride, molybdenum silicate, nickel nitride and cobalt nitride), silicided metal nitride (such as titanium silicon nitride, tantalum silicon nitride and tungsten silicon nitride), refractory metals, polysilicon, combinations thereof, and/or another suitable material.

The gate dielectrics 431B-433B may include a material such as, but not limited to, silicon oxide, silicon nitride, silicon oxynitride, hafnium oxide, tantalum oxide, hafnium silicon oxide, hafnium silicon oxynitride, hafnium tantalum oxide, hafnium titanium oxide, hafnium zirconium oxide, metal oxides, metal nitrides, metal silicates, transition metal-oxides, transition metal-nitrides, transition metal-silicates, oxynitrides of metals, metal aluminates, zirconium silicate, zirconium aluminate, tin oxide, zirconium oxide, titanium oxide, aluminum oxide, high-k dielectrics, and/or combinations thereof. Each of the gate dielectrics 431B-433B may have a thickness of about 5 Angstroms to about 150 Angstroms. In some embodiments, each of the gate dielectrics 431B-433B includes multi-layer structure of, for example, silicon oxide or silicon oxynitride with a high-k dielectric. In other embodiments, the gates 431-433 include the gate electrodes 431A-433A, respectively, and the gate dielectrics 431B-433B are omitted.

The spacers 441-446 are over the isolation structure 404 and the channel regions 421 and 422, and are located at the opposite sides of the corresponding gates 431-433. The spacers 441-446 may include a material such as, but not limited to, silicon nitride, silicon oxynitride and/or silicon carbide.

The gate contact 451 is located directly on the gate 432. The gate contact 451 is spaced from the source/drain contact(s) (e.g. the source/drain contacts 452-454 of FIG. 4) of the semiconductor device 400. The gate contact dielectric 451B surrounds the side surfaces of the conductive plug 451A. The conductive plug 451A directly contacts the gate 433. The conductive plug 451A may include a conductive material such as, but not limited to, titanium, titanium nitride, tantalum nitride, cobalt, ruthenium, platinum, tungsten, aluminum, copper, or combinations thereof. The gate contact dielectric 451B has a dielectric constant higher than 4.9. In addition, the gate contact dielectric 451B has a thickness of about 5 angstroms to about 100 angstroms, and preferably about 5 angstroms to about 50 angstroms. The gate contact dielectric 451B may include a material such as, but not limited to, nitride-based dielectric, silicon oxynitride, metal-oxide dielectric, hafnium oxide, tantalum oxide, titanium oxide, zirconium oxide, aluminum oxide, yttrium oxide, lanthanum oxide, or combinations thereof.

The source/drain contact 454 is located directly on the source/drains 423 and 424. The source/drain contact 454 is spaced from the gate contact 451 and the other source/drain contact(s) (e.g. the source/drain contacts 452-453 of FIG. 4) of the semiconductor device 400. The source/drain contact 454 includes a conductive plug 454A and a source/drain contact dielectric 454B surrounding the side surfaces of the conductive plug 454A. The conductive plug 454A directly contacts the source/drains 423-424, such that the source/drains 423-424 are electrically coupled. The conductive plugs 454A may include a conductive material such as, but not limited to, titanium, titanium nitride, tantalum nitride, cobalt, ruthenium, platinum, tungsten, aluminum, copper, or combinations thereof. The source/drain contact dielectric 454B has a dielectric constant higher than 4.9. In addition, each of the source/drain contact dielectrics 454B has a thickness of about 5 angstroms to about 100 angstroms, and preferably about 5 angstroms to about 50 angstroms. The source/drain contact dielectrics 454B may include a material such as, but not limited to, nitride-based dielectric, silicon oxynitride, metal-oxide dielectric, hafnium oxide, tantalum oxide, titanium oxide, zirconium oxide, aluminum oxide, yttrium oxide, lanthanum oxide, or combinations thereof.

The semiconductor device 400 further includes an interlayer dielectric (ILD) layer 406 over the substrate 402, the isolation structure 404, the first well region 411, the second well region 412, the fins 421A, 421B, 422A and 422B, the gates 431-433 and the spacers 441-446, and exposes the top surfaces of the gate contact 451 and the source/drain contacts 452-454 (the source/drain contacts 452 and 453 are not shown in FIG. 5A to FIG. 5C). The ILD layer 406 has a dielectric constant less than the dielectric constants of the gate contact dielectric 451B and source/drain contact dielectrics 452B-454B. In particular, the dielectric constant of the ILD layer 406 is less than 4.5, and preferably less than 4. The ILD layer 406 may include a material such as, but not limited to, silicon oxide, silicon nitride, silicon oxynitride, silicon carbide, silicon boron nitride, silicon carbon boron nitride, or combinations thereof.

The semiconductor device 400 includes an IMD layer 460 over the ILD layer 406, the gate contact 451 and the source/drain contacts 452-454. The IMD layer 460 includes interconnects, such as metal lines (e.g. the metal lines 471-477) and vias (e.g. the vias 461-464; the vias 462-463 are not shown in FIG. 5A to FIG. 5C), for electrically coupling the elements of the semiconductor device 400 with external devices. In some embodiments, the dielectric material of IMD layer 460 (without the interconnects in the IMD layer 460) includes a low-k dielectric material, such as silicon oxide and other suitable material of which a dielectric constant is less than that of the silicon oxide. As shown in FIG. 5A to FIG. 5C, the IMD layer 460 is over the ILD layer 406, the gate contact 451 and the source/drain contact 454, and in the IMD layer 460, the via 461 electrically couple the gate contact 451 and the metal line 474, and the via 464 electrically couple the source/drain contact 454 and the metal line 472. In some embodiments, the semiconductor device 400 includes further metal lines and/or vias (e.g. of one or more metal layers different than the metal lines 471-477 and the vias 461-464) in the IMD layer 460. Each of the interconnects of the IMD layer 460 may include a conductive material such as copper, aluminum, nickel, titanium, tungsten, combinations thereof, and/or another suitable conductive material.

It is noted that, although some elements are shown in FIG. 4 but are not shown in FIG. 5A to FIG. 5C, e.g. the source/drain contacts 452 and 453 and their underlying source/drains and the conductive vias 462 and 463, these elements may be arranged in a similar manner to the corresponding elements (e.g. the source/drain contact 454, the source/drains 423 and 424 and the conductive via 464) shown in FIG. 5A to FIG. 5C. In addition, the forming processes and materials for the elements of the semiconductor device 400 may be the same as or similar to those for the elements of the semiconductor device 100. For example, the gate contact 451 may be formed from the same material as those for forming the gate contacts 151 and 152, and the processes of forming the gate contact may be the same as those of forming the gate contacts 151 and 152.

The layout diagrams of the semiconductor device 100 of FIG. 1 and the semiconductor device 400 of FIG. 4 may be represented by several masks generated by one or more processors and/or stored in one or more non-transitory computer-readable media. For example, the layout diagram of the semiconductor device 100 of FIG. 1 is presented by at least one first mask corresponding to the channel regions 121 and 122, at least one second mask corresponding to the gates 132 and 133, at least one third mask corresponding to the gates 131 and 134, and at least one fourth mask corresponding to the spacers 141-148. Other formats for representing the layout 100 are within the scope of various embodiments. Examples of a non-transitory computer readable recording medium include, but are not limited to, an external/removable and/or internal/built-in storage or memory unit, e.g., one or more of an optical disk, such as a video compact disc (VCD) and a digital versatile disc (DVD), a magnetic disk, such as a hard disk and a floppy disk, a semiconductor memory, such as a read-only memory (ROM), a random access memory (RAM), a solid state drive (SSD), a flash drive, a memory card, and the like.

In accordance with some embodiments, a semiconductor device includes a substrate, a gate and a gate contact. The substrate has a well region which has a source, a drain and a channel region extending between the source and the drain. The gate is on the well region and extends across the channel region. The gate contact is directly on the gate and vertically overlaps with the channel region. The gate contact has a strip shape of which a ratio of a length to a width is at least 2. The gate contact includes a conductive plug and a contact dielectric. The conductive plug directly contacts the gate. The contact dielectric surrounds side surfaces of the conductive plug and has a frame shape. A dielectric constant of the contact dielectric is substantially greater than 4.9.

In accordance with certain embodiments, a method of forming a semiconductor device includes the following steps. A substrate is provided, which has a well region, the well region having a source, a drain and a channel region extending between the source and the drain. A gate is formed on the well region, and extends across the channel region. An ILD layer is formed on the substrate and the gate. The ILD layer is etched to form an opening exposing the gate and vertically overlapping with the channel region. The formed opening has a strip shape of which a ratio of a length to a width is at least 2. A contact dielectric is formed in the opening and substantially conformal to sidewalls of the opening. The contact dielectric is formed having a frame shape and a dielectric constant substantially greater than 4.9. A conductive plug is formed directly contacting the gate and bordering inner surfaces of the contact dielectric.

In accordance with some embodiments, a semiconductor device includes a first semiconductor structure and a second semiconductor structure of different types, a gate and a gate contact. Each of the first semiconductor structure and the second semiconductor structure has a source, a drain and a channel region extending between the source and the drain. The gate extends across the channel regions of the first semiconductor structure and the second semiconductor structure. The gate contact is directly on the gate, and has a strip shape of which a ratio of a length to a width is at least 2. The gate contact includes a conductive plug and a contact dielectric. The conductive plug directly contacts the gate. The contact dielectric surrounds side surfaces of the conductive plug and having a frame shape. A dielectric constant of the contact dielectric is substantially greater than 4.9.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate having a well region, the well region having a source, a drain and a channel region laterally between the source and the drain, wherein a plurality of fins are disposed on the channel region;
   a gate on the well region and laterally across the fins; and
   a gate contact directly on the gate and vertically overlapping with at least one of the fins, the gate contact having a first strip shape of which a ratio of a length to a width is at least 2 and comprising:
   a first conductive plug directly contacting the gate; and
   a gate contact dielectric surrounding side surfaces of the first conductive plug and having a first frame shape, wherein a dielectric constant of the gate contact dielectric is greater than 4.9.

2. The semiconductor device of claim 1, wherein a thickness of the gate contact dielectric is in a range from 5 angstroms to 50 angstroms.

3. The semiconductor device of claim 1, wherein a material of the gate contact dielectric is nitride-based dielectric, metal-oxide dielectric, hafnium oxide ($HfO_2$), tantalum oxide ($Ta_2O_5$), titanium oxide ($TiO_2$), zirconium oxide ($ZrO_2$), aluminum oxide ($Al_2O_3$), yttrium oxide ($Y_2O_3$), or combinations thereof.

4. The semiconductor device of claim 1, further comprising:
   an inter-layer dielectric (ILD) layer on the gate and the substrate, the ILD layer defining an opening on the gate, the opening filled by the gate contact;
   wherein the gate contact dielectric is conformal to sidewalls of the opening.

5. The semiconductor device of claim 4, wherein a dielectric constant of the ILD layer is less than 4.5.

6. The semiconductor device of claim 1, wherein a length of the gate contact extends in a first horizontal direction, and a length of each of the fins extends in a second horizontal direction perpendicular to the first horizontal direction.

7. The semiconductor device of claim 1, further comprising:
   a source/drain contact directly on the source or the drain, the source/drain contact comprising:
   a second conductive plug directly contacting the source or the drain; and
   a source/drain contact dielectric surrounding side surfaces of the second conductive plug and having a second frame shape, wherein a dielectric constant of the source/drain contact dielectric is greater than 4.9.

8. The semiconductor device of claim 7, further comprising:
   a first metal line electrically coupled to the gate contact through a first via; and
   a second metal line electrically coupled to the source/drain contact through a second via;
   wherein the first metal line and the second metal line are parallel to each other and are in a same metal layer, and wherein the first via vertically overlaps with at least one of the fins.

9. The semiconductor device of claim 7, wherein the source/drain contact has a second strip shape of which a ratio of a length to a width is at least 2.

10. The semiconductor device of claim 7, wherein a length of the gate contact and a length of the source/drain contact extend in a same horizontal direction.

11. The semiconductor device of claim 1, wherein a material of the first conductive plug is titanium, titanium nitride (TiN), tantalum nitride (TaN), cobalt, ruthenium, platinum, tungsten, aluminum, copper, or combinations thereof.

12. A semiconductor device, comprising:
a substrate having a well region, the well region having a source, a drain and a channel region laterally between the source and the drain, wherein a plurality of fins are disposed on the channel region;
a gate on the well region and laterally across the fins;
a gate contact directly on the gate and vertically overlapping with at least one of the fins, the gate contact having a first strip shape, wherein a ratio of a length of the first strip shape to a width of the first strip shape is at least 2, and the gate contact comprises:
a first conductive plug directly contacting the gate; and
a gate contact dielectric surrounding side surfaces of the first conductive plug and having a first frame shape, wherein a dielectric constant of the gate contact dielectric is greater than 4.9; and
a first metal line electrically coupled to the gate contact through a first via;
wherein a length of the gate contact extends in a first horizontal direction, and a length of the first metal line extends in a second horizontal direction that is perpendicular to the first horizontal direction.

13. The semiconductor device of claim 12, wherein a length of each of the fins extends in the second horizontal direction.

14. The semiconductor device of claim 12, further comprising:
a source/drain contact directly on the source or the drain, the source/drain contact comprising:
a second conductive plug directly contacting the source or the drain; and
a source/drain contact dielectric surrounding side surfaces of the second conductive plug and having a second frame shape, wherein a dielectric constant of the source/drain contact dielectric is greater than 4.9; and
a second metal line electrically coupled to the source/drain contact through a second via;
wherein a length of the source/drain contact extends in the first horizontal direction, and a length of the second metal line extends in the second horizontal direction.

15. The semiconductor device of claim 14, wherein the source/drain contact has a second strip shape, wherein a ratio of a length of the second strip shape to a width of the second strip shape is at least 2.

16. The semiconductor device of claim 12, wherein a thickness of the gate contact dielectric is in a range from 5 angstroms to 50 angstroms.

17. The semiconductor device of claim 12, wherein a material of the gate contact dielectric is nitride-based dielectric, metal-oxide dielectric, hafnium oxide ($HfO_2$), tantalum oxide ($Ta_2O_5$), titanium oxide ($TiO_2$), zirconium oxide ($ZrO_2$), aluminum oxide ($Al_2O_3$), yttrium oxide ($Y_2O_3$), or combinations thereof.

18. The semiconductor device of claim 12, further comprising:
an inter-layer dielectric (ILD) layer on the gate and the substrate, the ILD layer defining an opening on the gate, the opening filled by the gate contact;
wherein the gate contact dielectric is conformal to sidewalls of the opening, and a dielectric constant of the ILD layer is less than 4.5.

19. The semiconductor device of claim 12, wherein a material of the first conductive plug is titanium, titanium nitride (TiN), tantalum nitride (TaN), cobalt, ruthenium, platinum, tungsten, aluminum, copper, or combinations thereof.

20. A semiconductor device, comprising:
a substrate having a well region, the well region having a source, a drain and a channel region laterally between the source and the drain, wherein a plurality of fins are disposed on the channel region;
a gate on the well region and laterally across the fins;
a gate contact directly on the gate and vertically overlapping with at least one of the fins, the gate contact having a strip shape, wherein a ratio of a length of the strip shape to a width of the strip shape is at least 2, and the gate contact comprises:
a first conductive plug directly contacting the gate; and
a gate contact dielectric surrounding side surfaces of the first conductive plug and having a first frame shape, wherein a dielectric constant of the gate contact dielectric is greater than 4.9;
a first metal line electrically coupled to the gate contact through a first via;
a source/drain contact directly on the source or the drain, the source/drain contact comprising:
a second conductive plug directly contacting the source or the drain; and
a source/drain contact dielectric surrounding side surfaces of the second conductive plug and having a second frame shape, wherein a dielectric constant of the source/drain contact dielectric is greater than 4.9; and
a second metal line electrically coupled to the source/drain contact through a second via;
wherein each of a length of the gate contact and a length of the source/drain region extends in a first horizontal direction, and each of a length of each of the fins, a length of the first metal line and a length of the second metal line extend in a second horizontal direction that is perpendicular to the first horizontal direction.

* * * * *